(12) United States Patent
Rhinow et al.

(10) Patent No.: US 12,535,726 B2
(45) Date of Patent: Jan. 27, 2026

(54) METHOD AND APPARATUS FOR SETTING A SIDE WALL ANGLE OF A PATTERN ELEMENT OF A PHOTOLITHOGRAPHIC MASK

(71) Applicant: Carl Zeiss SMT GmbH, Oberkochen (DE)

(72) Inventors: Daniel Rhinow, Frankfurt am Main (DE); Joachim Welte, Darmstadt (DE); Markus Bauer, Schneckenlohe (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 542 days.

(21) Appl. No.: 18/075,949

(22) Filed: Dec. 6, 2022

(65) Prior Publication Data

US 2023/0109566 A1   Apr. 6, 2023

Related U.S. Application Data

(63) Continuation of application No. PCT/EP2021/067838, filed on Jun. 29, 2021.

(30) Foreign Application Priority Data

Jun. 30, 2020   (DE) .......................... 102020208185.9

(51) Int. Cl.
*G03F 1/24* (2012.01)
*G03F 1/74* (2012.01)
*G03F 1/78* (2012.01)
*G03F 1/86* (2012.01)
*G03F 7/00* (2006.01)

(52) U.S. Cl.
CPC .................. *G03F 1/24* (2013.01); *G03F 1/74* (2013.01); *G03F 1/78* (2013.01); *G03F 1/86* (2013.01); *G03F 7/7065* (2013.01)

(58) Field of Classification Search
CPC ........................................................ G03F 1/24
See application file for complete search history.

(56) References Cited

U.S. PATENT DOCUMENTS 5,485,497 A    1/1996   Oizumi et al.
7,198,872 B2   4/2007   Gallagher et al.
(Continued)

FOREIGN PATENT DOCUMENTS

| CN | 1726431 | 1/2006 | ............... G03F 1/00 |
| DE | 102019201468 | 8/2020 | ............... G03F 1/74 |

(Continued)

OTHER PUBLICATIONS

Machine Translation of JP2003133203 (Year: 2025).*
(Continued)

*Primary Examiner* — Chanceity N Robinson
(74) *Attorney, Agent, or Firm* — Fish & Richardson P.C.

(57) ABSTRACT

A method for setting at least one side wall angle of at least one pattern element of a photolithographic mask including the steps of: (a) providing at least one precursor gas; (b) providing at least one massive particle beam which induces a local chemical reaction of the at least one precursor gas; and (c) altering at least one parameter of the particle beam and/or a process parameter during the local chemical reaction in order to set the at least one side wall angle of the at least one pattern element.

22 Claims, 22 Drawing Sheets

(56) References Cited

U.S. PATENT DOCUMENTS

| | | | |
|---|---|---|---|
| 9,285,672 B2 | 3/2016 | Fukugami et al. | |
| 2004/0175631 A1 | 9/2004 | Crocker et al. | |
| 2006/0147814 A1 | 7/2006 | Liang | |
| 2009/0097004 A1 | 4/2009 | Trogisch et al. | |
| 2010/0112464 A1* | 5/2010 | Kanamitsu | G03F 1/74 |
| | | | 430/5 |
| 2016/0111254 A1 | 4/2016 | Evans et al. | |
| 2019/0391482 A1 | 12/2019 | Oster et al. | |
| 2020/0096862 A1* | 3/2020 | Tolani | G03F 1/22 |
| 2020/0249564 A1* | 8/2020 | Budach | G03F 1/74 |

FOREIGN PATENT DOCUMENTS

| | | | | |
|---|---|---|---|---|
| JP | 2003-133203 | | 5/2003 | H01L 21/027 |
| JP | 2003133203 A | * | 5/2003 | |
| JP | 2003-228161 | | 8/2003 | G03F 1/08 |
| JP | 2004-294613 | | 10/2004 | G03F 1/08 |
| JP | 2004294613 A | * | 10/2004 | |
| JP | 2010-109164 | | 5/2010 | H01L 21/027 |
| JP | 2017-534145 | | 11/2017 | H01J 37/305 |
| KR | 1020170070162 | | 6/2017 | H01J 37/32 |
| KR | 1020190119656 | | 10/2019 | G03F 1/72 |
| TW | 200639596 | | 11/2006 | G03F 9/00 |

OTHER PUBLICATIONS

Machine Translation JP 2004294613 (Year: 2025).*
Office Action issued by the Japanese Patent Office for Application No. JP 2023-500049, dated Jan. 22, 2024 (English Translation Only).
Office Action Issued by the Korean Patent Office for Application No. KR 10-2023-7002795 dated Jan. 21, 2025 (English Translation Only).
Office Action issued by the Taiwan Patent Office and Search Report for Application No. TW 110123800, Dated Oct. 6, 2022.
International Search Report for International Application No. PCT/EP2021/067838, dated Oct. 18, 2021.
Melvin III, et al., "Impact of EUV Mask Absorber Sidewall Angle on Patterning Robustness", *Proceedings of SPIE.*, vol. 10583, Extreme Ultraviolet (EUV) Lithography IX, 10583614 (Mar. 19, 2018).

* cited by examiner

Fig. 1
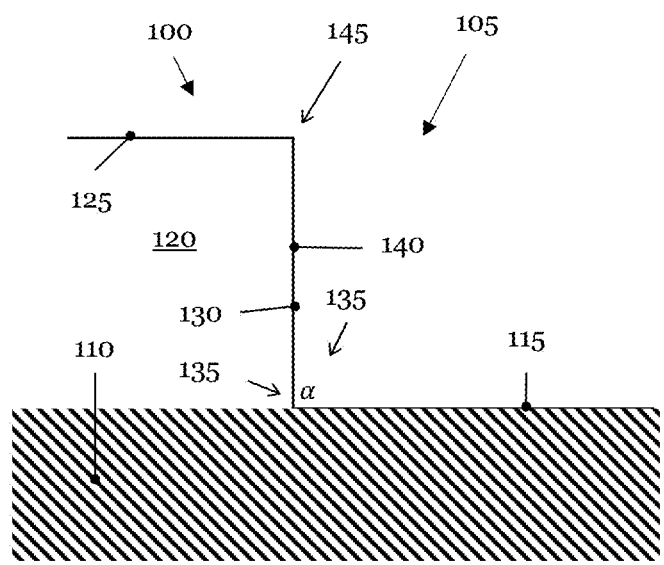
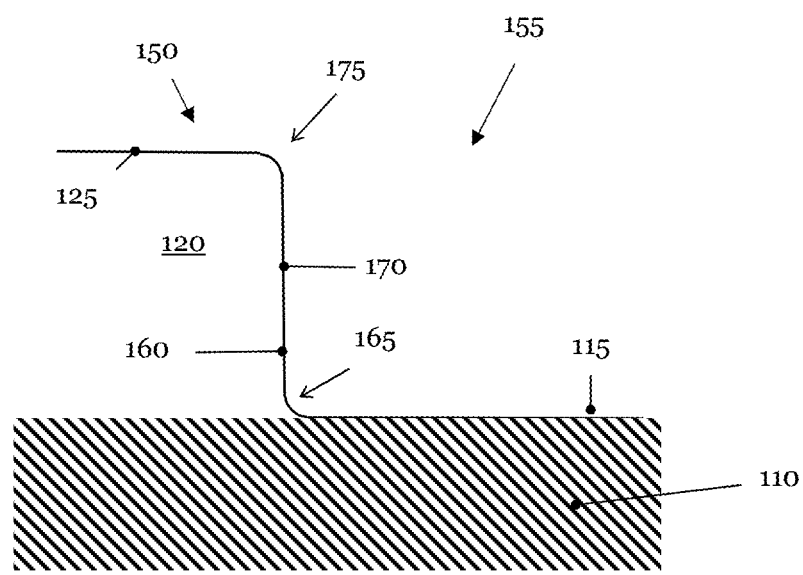

Fig. 9 (Prior art)
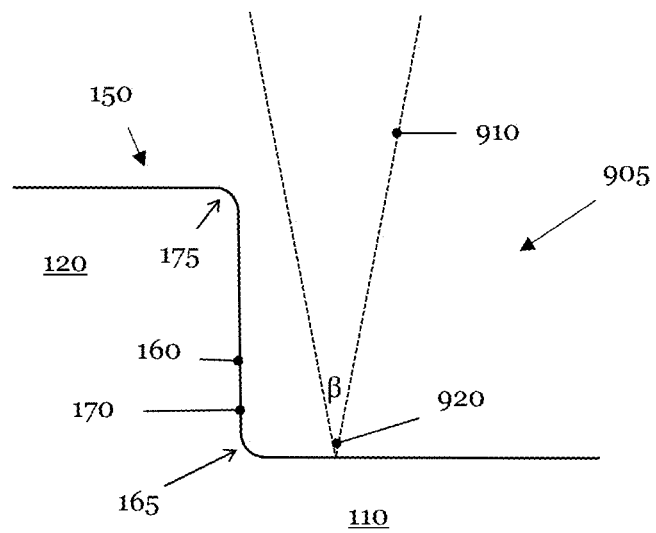
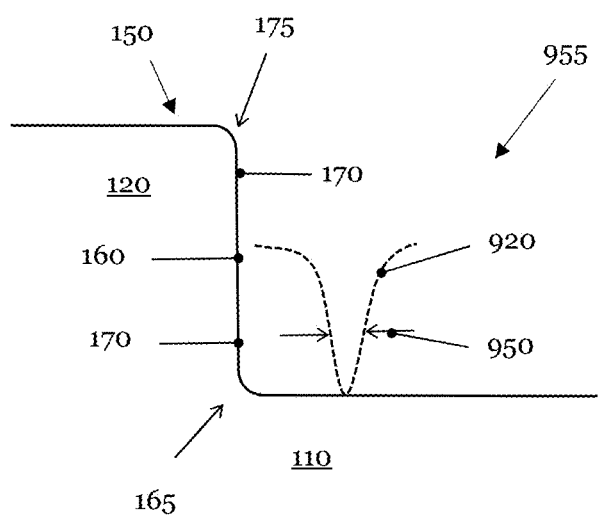

Fig. 13
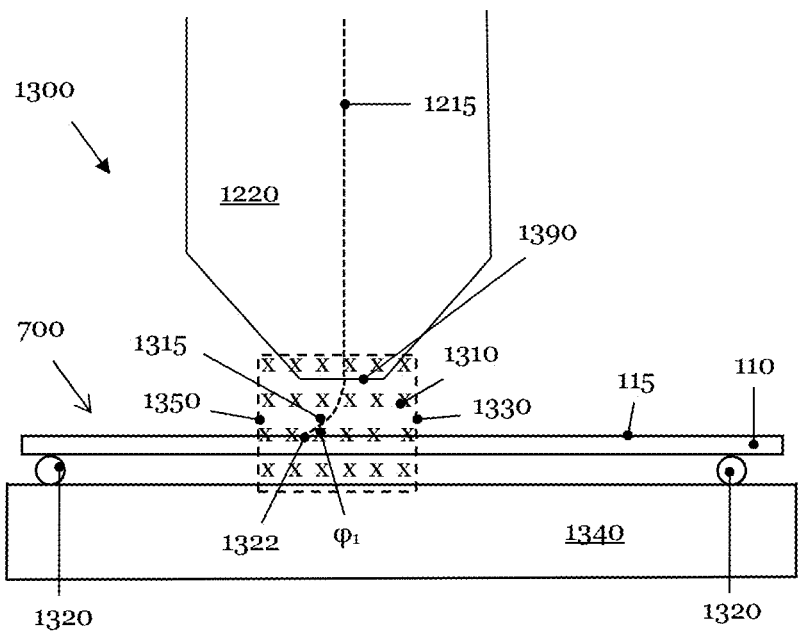
Fit. 14
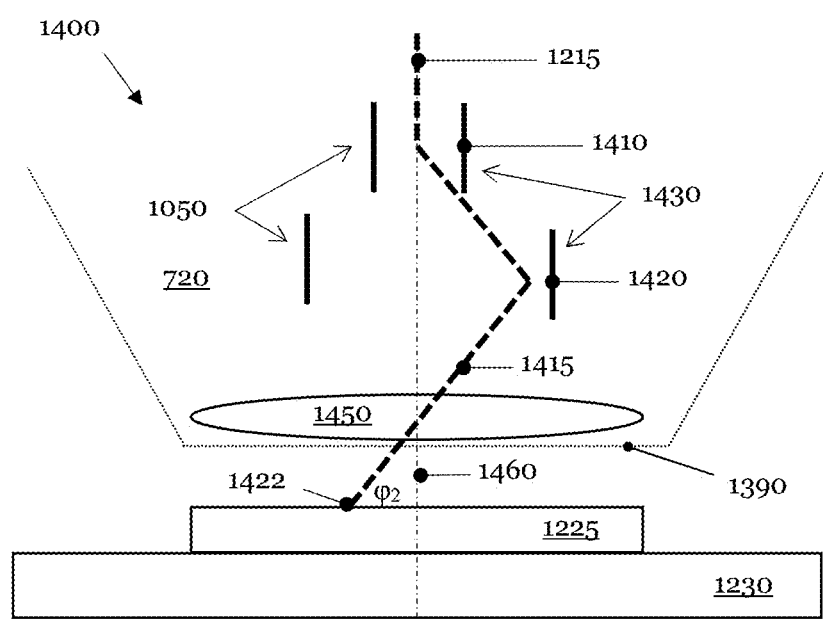

Fig. 22
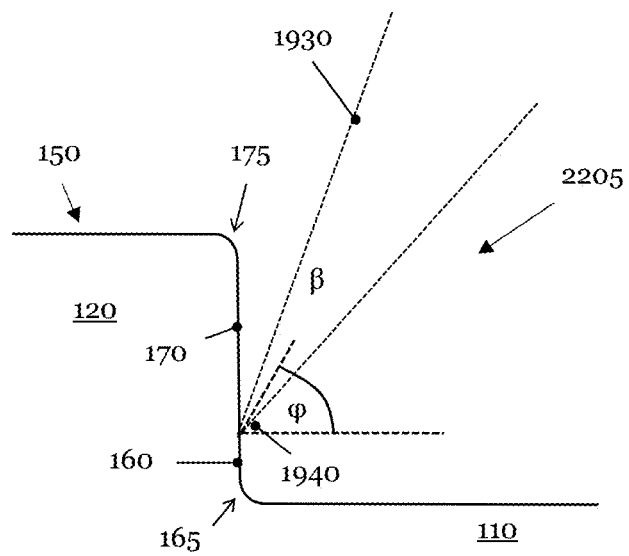
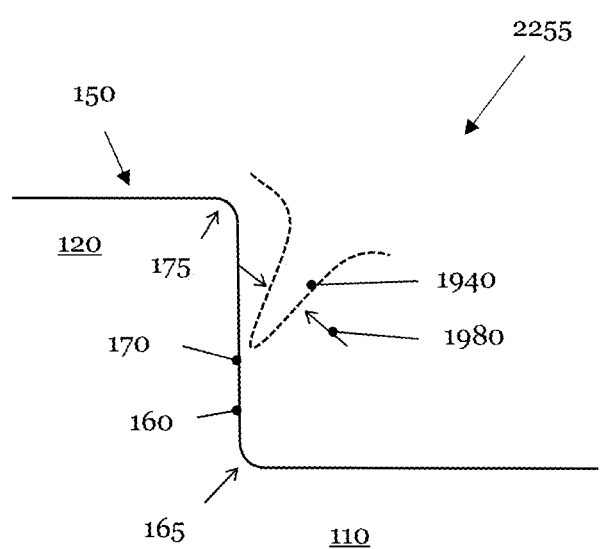

METHOD AND APPARATUS FOR SETTING A SIDE WALL ANGLE OF A PATTERN ELEMENT OF A PHOTOLITHOGRAPHIC MASK

CROSS REFERENCE TO RELATED APPLICATIONS

This application is a continuation of and claims priority under 35 U.S.C. § 120 from PCT Application No. PCT/EP2021/067838, filed on Jun. 29, 2021, which claims priority from German patent application DE 10 2020 208 185.9, entitled "Verfahren und Vorrichtung zum Einstellen eines Seitenwandwinkels eines Pattern-Elements einer fotolithographischen Maske," filed on Jun. 30, 2020. The entire contents of each of the above priority applications are incorporated herein by reference.

TECHNICAL FIELD

The present invention relates to a method and an apparatus for setting a side wall angle of a pattern element of a photolithographic mask. Further, the present invention relates to a method and an apparatus for examining a defect of a photolithographic mask.

BACKGROUND

As a consequence of the growing integration density in the semiconductor industry, photolithographic masks have to image increasingly smaller structures on wafers. One option of accommodating this trend lies in the use of photolithographic masks whose actinic wavelength is shifted to ever shorter wavelengths. Currently, ArF (argon fluoride) excimer lasers that emit at a wavelength of approximately 193 nm are frequently used in photolithography as light sources.

Lithography systems are being developed today that use electromagnetic radiation in the EUV (extreme ultraviolet) wavelength range (preferably in the range of 10 nm to 15 nm). Said EUV lithography systems are based on a completely new beam guiding concept which uses reflective optical elements, since no materials are currently available that are optically transparent in the stated EUV range. The technological challenges in developing EUV systems are enormous, and tremendous development efforts are necessary to bring said systems to a level where they are ready for industrial application.

A significant contribution to the imaging of ever smaller structures in the photoresist arranged on a wafer is due to photolithographic masks, exposure masks, photomasks or just masks. With every further increase in integration density, it becomes increasingly more important to reduce the minimum structure size of the exposure masks. The production process of photolithographic masks therefore becomes increasingly more complex and as a result more time-consuming and ultimately also more expensive. Due to the minute structure sizes of the pattern elements, defects during mask production cannot be ruled out. These must be repaired—whenever possible.

The problem described applies even more to nanoimprint lithography. In the case of nanoimprint lithography, the structure transfer from the nanostructured template into a positive applied to a substrate is implemented 1:1. Therefore, there are increased requirements in respect of maintaining the structure dimensions and the side wall angle for this lithography technique. These increased requirements also apply to the repair of defects of nanoimprint templates.

On account of the novel beam guiding concept, which makes exclusive use of reflective optical elements including the EUV photomask, the latter cannot be exposed in perpendicular fashion. Rather, the EUV radiation in current EUV mask exposure systems strikes the patterned surface of the EUV mask at an angle of 5° to 6° in relation to the normal. The oblique incidence of light leads to various difficulties. Some are described in exemplary documents and appropriate solutions are described therein: U.S. Pat. Nos. 5,485,497, 7,198,872 B2 and 9,285,672 B2.

Currently, mask defects are frequently repaired by electron beam-induced local deposition and/or etching processes. The demands on the repair processes are ever more challenging on account of the reducing structure sizes of the structure elements or pattern elements. It is for this reason that, in addition to the previously known characterization variables of photolithographic masks such as the critical dimension (CD) and/or the edge position, further descriptive variables are becoming increasingly important. In particular, the edge slope or the side wall angle of the structure element or pattern element should be mentioned in this context.

As described in DE 10 2019 201 468.2, a side wall angle (SWA) or an edge slope of a repaired pattern element which comes as close as possible to the design of the specified reference structure is sought after during the repair of defects. This is typically a side wall angle of 90°. This applies in particular to the correction of photomasks for the EUV wavelength range.

On the other hand, in the article "Impact of EUV mask absorber sidewall angle on patterning robustness," Proc. SPIE, Vol. 10583, Extreme Ultraviolet (EUV) Lithography IX, 1058314 (19 Mar. 2018), https://doi.org/10.11117/12.2296865, the authors L. S. Mervin III et al. describe simulations which suggest that a side wall angle deviating from 90° may have expedient characteristics for the imaging behavior of EUV masks under certain circumstances.

Against this background, the present invention therefore addresses the problem of specifying methods and apparatuses that allow an improvement in the repair of photolithographic masks.

SUMMARY

As per one exemplary embodiment of the present invention, this problem is solved by means of a method according to Claim 1 and an apparatus according to Claim 17. In a further exemplary embodiment, this problem is solved by means of a method according to Claim 10 and an apparatus according to Claim 19.

In one embodiment, the method for setting at least one side wall angle of at least one pattern element of a photolithographic mask includes the steps of: (a) providing at least one precursor gas; (b) providing at least one massive particle beam which is embodied to induce a local chemical reaction of the at least one precursor gas; and (c) altering at least one parameter of the particle beam and/or a process parameter during the local chemical reaction in order to set the at least one side wall angle of the at least one pattern element.

The method according to the invention facilitates targeted setting of a side wall angle of a pattern element of a photolithographic mask. The latter can lie in an angular region that deviates from 90°. This opens up an additional degree of freedom, which can be used to improve the imaging properties of photolithographic masks. By way of example, this degree of freedom facilitates an increase in the process window within which a photomask with a side wall angle set in defined fashion can be operated. Moreover, other weaknesses or imperfect or non-ideal properties of the mask can be compensated on account of the additional degree of freedom. The option of controlling the edge slope or the side wall angle consequently allows the optical properties of the photolithographic mask to be improved.

When repairing templates and/or substrates within nano-imprint lithography (NIL), the method according to the invention can be used to satisfy the stringent demands in respect of the edge slope.

In this application, the expressions edge slope and side wall angle are used synonymously.

The at least one precursor gas can comprise at least one etching gas and the local chemical reaction can comprise an etching reaction or the at least one precursor gas can comprise at least one deposition gas and the local chemical reaction can comprise a deposition reaction.

The at least one massive particle beam can induce the local chemical reaction at the location of the side wall angle to be set. The at least one massive particle beam can induce the local chemical reaction at the location of a defect of the photolithographic mask.

A massive particle beam, for example an electron beam or an ion beam, can be focused onto a spot diameter in the region of a few nanometers. This allows a chemical reaction with a tightly delimited reaction area to be carried out. By way of example, the diameter of the local chemical reaction can be restricted to a small multiple of the spot diameter of the particle beam, for instance to two to five times the spot diameter. A process resolution limit of a local chemical reaction in one dimension can consequently be in the range of 1 nm to 30 nm, preferably 2 nm to 20 nm, more preferably 2 nm to 15 nm, and most preferably 2 nm to 10 nm.

The at least one side wall angle can be set while a defect of the photolithographic mask is repaired.

The angle of a side wall or an edge slope of a pattern element of a mask, which has an angle of substantially 90°, consequently does not represent a defect of the mask but has precisely the value specified by the design. The method according to the invention allows an angle of a side wall of a pattern element to be altered in targeted fashion or allows it to be set to a specific value that differs from 90° in order to achieve one or more of the above-described advantages, for example an increase in the process window. Further, targeted setting of one or more side wall angles of one or more pattern elements can compensate a weakness of the photomask. A weakness of a photolithographic mask is a parameter which still lies within a specified numerical range but comes close to a range limit.

However, the side wall angle of a pattern element is typically set in defined fashion during a repair process for the photomask. Defects of the photolithographic masks that occur frequently are dark defects which are caused by excess material, for instance excess absorber material. The excess material is frequently removed from the mask by carrying out an EBIE (electron beam induced etching) process. While the excess material is removed, the angle of the newly formed side wall of the pattern element is set to a desired or specified value.

A missing material defect is referred to as a white defect if the missing material is absorbing material. This is corrected by the deposition of absorbing material, for instance chromium or tantalum nitride, for example in an EBID (electron beam induced deposition) process. When the EBID process is carried out, care is taken that the newly forming side wall has a side wall angle within a specified range.

It is self-evident that the method according to the invention can also be used to set a side wall angle of a phase shifting element of a phase shifting mask. Further, the method according to the invention can naturally also be used to set a side wall angle of an element of an NIL template.

Here and elsewhere in this description, the expression "substantially" denotes an indication of a measurement variable within the conventional measurement errors if measuring appliances according to the prior art are used to determine the measurement variable.

Altering the at least one parameter of the at least one particle beam can comprise at least altering an element from the group of:
  a centrosymmetric setting of at least one condenser aperture of an imaging system of at least one particle beam source in respect of an optical axis of the massive particle beam,
  a non-round setting of at least one aperture of the imaging system of the at least one particle beam source,
  an adjustment of the imaging system of the at least one particle beam source for tilting the massive particle beam in relation to a perpendicular to the patterned surface of the photolithographic mask,
  a setting of a deflection system for tilting the massive particle beam in relation to the perpendicular to the patterned surface of the photolithographic mask, and
  a setting of the beam profile of the massive particle beam during the local chemical reaction.

In the prior art, a set of parameters characterizing the massive particle beam are defined at the start of a processing process of a photolithographic mask and the processing process, i.e., setting a side wall angle and/or repairing a defect, is carried out using these parameters. Typically, the parameters of the system imaging the massive particle beam are chosen in such a way that the particle beam runs as precisely as possible along the optical axis of the imaging system. This achieves optical imaging of the particle beam source which has substantially no aberrations or only a small aberration component.

However, the inventors have recognized that it may be advantageous to deliberately guide the particle beam in a manner deviating from the optical axis of the imaging system of the particle beam source if the massive particle beam is used to initiate a local chemical reaction. It may likewise be expedient to choose a beam profile which deviates from circular symmetry. These settings increase the aberrations of the generated particle beam. However, these negative effects on the imaging properties of the particle beam are accepted when the latter is used to induce a local chemical reaction since the particle beam is only used to supply power. It is even possible for a distorted particle beam to generate an energy dose distribution which accelerates the local chemical reaction in comparison with a largely aberration-free massive particle beam.

An additional degree of freedom which allows the edge slope of the pattern element of a photomask and/or of an element of an NIL template to be adjusted to a specified value in addition to the repair of a defect is opened up by the above-described change of one or more parameters of the imaging system of the particle beam source while a local chemical reaction is carried out.

Condenser apertures of current scanning electron systems (SEM) typically have a diameter ranging from 10 µm to 60 µm. The opening or the diameter of the condenser aperture or simply the aperture essentially determines an aperture angle or an opening angle of a particle beam incident on a sample. The larger the aperture opening the larger the opening angle of the particle beam. However, at larger aperture openings the aberrations also become visible. Moreover, smaller kinetic energies of the particles of the particle beam also result in enlarged aberrations.

A non-centrosymmetric setting of the electron beam can be related to the center of the round condenser aperture. The two extremal values of the setting are: The electron beam passes through the center of the condenser aperture in perpendicular fashion and the beam passes through in perpendicular fashion along an edge of the condenser aperture.

Setting the at least one non-round aperture can comprise an eccentricity $\varepsilon$ in the region of $0<\varepsilon<0.1$, preferably $0<\varepsilon<0.2$, more preferably $0<\varepsilon<0.5$, and most preferably $0<\varepsilon<0.8$.

Adjusting the imaging system of the at least one particle beam may comprise: altering an angle of incidence of the massive particle beam on a surface of the at least one pattern element in a range from 89° to 91°, preferably from 80° to 93°, more preferably from 70° to 100°, and most preferably from 60° to 120°. Altering in a range can be understood to be the application of a particle beam with an angle of incidence with at least one numerical value which is located approximately at the upper limit of the range (e.g., approximately 93° for the interval of 80° to 93°) and/or the application of a particle beam with an angle of incidence whose numerical value is approximately at the lower limit of the range (e.g., approximately 80° for the interval of 80° to 93° again).

Altering the setting of the beam profile can comprise: altering the setting of the beam profile from a round beam profile to an asymmetric beam profile. The asymmetric beam profile can comprise an elliptic beam profile. The eccentricity $\varepsilon$ of an elliptic beam profile can comprise a range of: $0\leq\varepsilon<0.1$, preferably $0\leq\varepsilon<0.2$, more preferably $0\leq\varepsilon<0.5$, and most preferably $0\leq\varepsilon<0.8$.

Altering the at least one process parameter can comprise at least one element from the group:
dividing a repair shape into at least two partial repair shapes for processing the at least two partial repair shapes with different process parameters,
altering at least one parameter from the group of: a repetition time (frame refresh time), a dwell time, a spacing of adjacent scanning points of the massive particle beam (line step), and an acceleration voltage of the at least one massive particle beam during the local chemical reaction,
altering a size of the repair shape during the local chemical reaction, and
altering a position of the repair shape during the local chemical reaction.

Currently, defects of photolithographic masks are corrected by virtue of ascertaining a parameter set for the process of the repair of the defect. Using this set process parameter set, the defect then is removed by scanning the massive particle beam over the defect with the provision of an appropriate precursor gas or a side wall of a pattern element is generated with a specified angle. However, the repair of many defects is more promising if at least one of the process parameters is locally and/or temporally adjusted during the defect repair to the respective defect to be repaired.

A repair shape describes the projection of a defect to be repaired onto its base. Here, each pixel of the base is assigned an energy dose to be deposited, which reflects the time duration of the local chemical reaction at the location of the corresponding pixel and which corresponds to the extent of the defect at the respective pixel location.

By virtue of dividing a repair shape into two or more partial repair shapes and assigning each partial repair shape a distinct set of process parameters, it is possible firstly to improve the repair of the defect and secondly it is possible to shape an edge slope, formed during the defect repair, with an angle within a specified interval as a result of the additional degree or degrees of freedom.

The repetition time depends significantly on the process to be carried out in each case. By way of example, the size of the repair shape is an important variable. Further, the repetition time should be chosen in such a way that a gas coverage of the repair shape is re-established within the repetition time. If these constraints are observed, the repetition time at the start of the local chemical reaction can have a duration ranging from $10^{-8}$ s to $10^{-6}$ s and the repetition time at the end thereof can have a duration ranging from $10^{-7}$ s to $10^{-5}$ s.

The dwell time at the start of the local chemical reaction can have a duration ranging from $10^{-9}$ s to $10^{-7}$ s and the repetition time at the end thereof can have a duration ranging from $10^{-7}$ s to $10^{-6}$ s.

The spacing of adjacent scanning points of the massive particle beam can comprise a range of 40 nm to 20 nm at the start of the local chemical reaction and can comprise a range from 10 nm to 1 nm at the end thereof.

The acceleration voltage of the massive particle beam can comprise a range of 5 keV to 1 keV at the start of the local chemical reaction and can comprise a range from 1 keV to 0.1 keV at the end thereof. This acceleration voltage range applies to a massive particle beam in the form of an electron beam in particular. In general, higher acceleration voltages are required for more massive particles such as ions, for example.

Additional degrees of freedom arise by setting one or more of the four last-mentioned process parameters, which can be used firstly to improve a defect repair and which can be used secondly to adjust an edge slope of one or more edges or side walls generated during the defect repair within a specified angular range.

Further, the provision of the at least one precursor gas can be adjusted to the altering of one or more process parameters. The provision of the at least one precursor gas can comprise setting a gas mass flow, a temperature and/or a composition of the at least one precursor gas.

The size of the repair shape in one dimension can change from the start to the end of the local chemical reaction by at least 5%, preferably by at least 30%, more preferably by at least 50%, and most preferably by at least 100% in relation to a process resolution limit in one dimension.

A time-dependent change of a repair shape in one dimension renders it possible to set the edge slope of two side walls, which were generated on both sides of the repair shape, in defined fashion.

The position of an edge of the repair shape can change from the start to the end of the local chemical reaction by at least 5%, preferably by at least 30%, more preferably by at least 50%, and most preferably by at least 100% in relation to a process resolution limit in one dimension.

Displacing the repair shape in one direction while carrying out a local chemical reaction allows an edge slope to be set in the direction of the displaced repair shape.

Altering at least one parameter of the particle beam and/or a process parameter during the local chemical reaction can set the at least one side wall angle within a range of 85° to 95°, preferably 80° to 100°, more preferably 75° to 105°, most preferably from 70° to 110°.

The method according to the invention can further include the steps of: (a) interrupting the local chemical reaction; and (b) examining a defect residue of the at least one defect and/or of a side wall generated during the local chemical reaction.

Further, the method according to the invention can include the steps of: (c) altering at least one parameter of the particle beam and/or of a process parameter which were previously left unaltered during the local chemical reaction should this be required by the examined defect residue and/or the generated side wall; and (d) continuing the local chemical reaction with the at least one altered parameter or continuing the local chemical reaction with the unaltered parameters should this not be required by the examined defect residue and/or the generated side wall.

A previously generated edge slope is used to decide whether it is necessary to alter one or more of the parameters previously left unaltered. A change is required if the previously generated edge slope is located outside a specified angle range.

One or more parameters are altered while a local chemical reaction is carried out in the method defined in this application. The method described can be additionally interrupted while it is being carried out and the remaining defect or the generated side wall can be examined. If the examination results show that the demanded edge slope cannot be attained with the varied parameter or parameters then one or more of those parameters that were not altered within the scope of the repair process hitherto are altered and the local chemical reaction is continued with the additionally altered parameters. In the process, it is possible to alter or keep constant the parameters varied in the course of the repair process hitherto.

In a second embodiment, the method for examining at least one defect of a photolithographic mask using at least one massive particle beam includes the steps of: (a) providing at least one massive particle beam; and (b) altering a mean angle of incidence of the massive particle beam on the at least one defect during the examination of the at least one defect.

Typically, a massive particle beam strikes an object to be examined, for example a defect of a photolithographic mask, in perpendicular fashion. In the case of the small working distance between the photolithographic mask and the part of the particle-optical system facing the mask, it is only possible for these two components to be substantially aligned parallel to one another, as a result of which the particle beam is incident on the photolithographic mask in substantially perpendicular fashion. As already explained above, a massive particle beam can be focused to a spot diameter ranging from a few nanometers to the sub-nanometer range. This results in a very high lateral resolution. However, the resolution is significantly lower in the beam direction. Consequently, the height resolution suffers during the examination of a three-dimensional (3D) object using a massive particle beam. Therefore, a 3D object generated from the measurement data, for instance an image of a defect, is afflicted by great uncertainty. By way of example, this uncertainty of a 3D image of a defect is translated into a large error interval of the parameters of a repair shape determined from the examinations.

This uncertainty can be significantly reduced by scanning the defect from different angles using massive particle beams. As a result, it is possible to ascertain a precise 3D contour of the examined defect.

As already discussed above, deflecting a particle beam may increase its aberrations compared to a particle beam which perpendicularly incidents on a sample, for example a photolithographic mask. However, this detrimental effect is small compared to the opportunities opened up by the new degree of freedom, which for example allows imaging defects as 3D objects.

Typically, a particle beam senses a scan region of a photolithographic mask or of a defect by virtue of the particle beam being scanned line-by-line over the scan region. There is a minor change in the angle of incidence of the particle beam on the surface of the sample while a line is being scanned. The change in the angle of incidence on the surface of a photolithographic mask specified under point (b) above does not refer to this change in angle of the particle beam during a line scan or, in general, during the sensing of a scan region. The term "mean angle of incidence" is introduced to distinguish the above-defined change in the angle of incidence from the change in angle of incidence during a line scan. Said term describes the mean angle at which a particle beam is incident on a sample during a line scan. By way of example, the mean angle of incidence can be defined as the arithmetic mean over all angles of incidence of a line scan or, in general, of a scan region of the particle beam.

The at least one defect can comprise at least one element from the group of:
  missing material of a pattern element,
  excess material of a pattern element,
  missing material of a substrate of the photolithographic mask,
  excess material of the substrate of the photolithographic mask,
  missing material of an element on an NIL substrate and/or an NIL template,
  excess material of an element on an NIL substrate and/or an NIL template,
  a side wall angle outside of a specified range,
  a radius of curvature of a side wall of the at least one pattern element in relation to its surface, which radius of curvature is outside a specified range, and
  a radius of curvature of the side wall of the at least one pattern element in relation to the substrate of the photolithographic mask, which radius of curvature is outside a specified range.

Altering the angle of incidence of the at least one massive particle beam can comprise: deflecting the massive particle beam in an electric field and/or in a magnetic field.

The angle of incidence of a massive particle beam on a defect can be altered most easily by virtue of the mask having the defect being rotated about an axis perpendicular to the normal of the patterned side of the photomask. However, this embodiment often runs into the problem that the distance between a beam emergence point of an imaging system of a particle beam source of the massive particle beam and the patterned surface of the mask is frequently only so small that the mask cannot be tilted or can only be tilted to a small extent in relation to the beam direction of the particle beam. For the same reason, tilting the imaging system of the particle beam source in relation to the patterned surface of a photomask is frequently likewise only possible to a restricted extent.

By forming an electric and/or a magnetic field between the beam exit of the massive particle beam from the imaging system and the mask and/or in the part of the imaging system adjacent to the beam exit, it is possible to largely avoid the spatial constraints and the massive particle beam can be deflected through a defined angle in relation to the optical axis of the imaging system of the particle beam.

The method for examining at least one defect can further include the step of: ascertaining a three-dimensional contour of the at least one defect from the measurement data obtained during the examination.

As explained above, scanning a defect under different angles increases the spatial resolution thereof in the z-direction or in the beam direction. As a result, it is possible to determine a 3-D contour of a defect, which was scanned by a massive particle beam at different angles, with great precision.

The method for examining at least one defect can further include the step of: determining parameters of a repair shape for the at least one examined defect.

A repair apparatus can repair a defect on the basis of the parameterized repair shape, i.e., a repair shape, whose parameters are determined. However, it is also possible that a repair shape defines setting a defined side wall angle of one or more pattern elements, the side wall angles of which are located outside of a specified angular range. By way of example, a pattern element might have an edge slope of substantially 90° while its side wall angle should lie within an angular range of 95° to 98°, for example.

Altering the angle of incidence can comprise: altering the angle of incidence by >5°, preferably by >10°, preferably by >20°, and most preferably by >400 in relation to a perpendicular incidence of the at least one massive particle beam on a substrate of the photolithographic mask.

The acceleration voltage for examining the at least one defect can comprise a range of 100 keV to 0.01 keV, preferably 20 keV to 0.02 keV, more preferably 5 keV to 0.05 keV, and most preferably 3 keV to 0.1 keV.

If electron beams are used as massive particles, the acceleration voltage of which lies in the region of 1 keV (kiloelectron volt), electric voltages in the region of several 100 V can generate electric fields which deflect the electron beams through the aforementioned angles.

Upon incidence on the photolithographic mask, the massive particle beam may have a focal diameter of 0.1 nm to 1000 nm, preferably 0.2 nm to 200 nm, more preferably 0.4 nm to 50 nm and most preferably 0.5 nm to 20 nm.

These focal diameters of the massive particle beam preferably apply to the examination of a defect by exposing the defect under different angles of incidence. On account of the accepted aberrations of the particle beam, the focal diameter is generally greater when setting a side wall angle by carrying out a local chemical reaction. This increase depends on the angle of incidence of the particle beam on the respective defect site. The aberrations and hence the increase in the focal diameter can be minimized by appropriate settings of the particle optical system.

The massive particle beam may have an aperture angle of 0.1° to 60°, preferably 0.2° to 40°, more preferably 0.5° to 20° and most preferably 10 to 10°.

Thus, for the most preferred aperture angle of the massive particle beam, a change or a variation of the angle of incidence may be larger than its aperture angle. A change or a variation of the aperture angle of the massive particle beam can exceed its most preferred aperture angle by a factor of 1.5, preferably by a factor of 2, more preferably by a factor of 4, and most preferably by a factor of 6. If the aperture angle of the massive particle beam is close to the lower limit, i.e., in an angle region of about 0.5° to 2.0°, the variation of the angle of incidence can exceed the aperture angle by a factor of 2, preferably by a factor of 5, more preferably by a factor of 10, and most preferably by a factor of 20.

The greater the aperture angle of the particle beam, the smaller its focal diameter. Therefore, particle beams with a large aperture angle are often used to examine a defect while—depending on the precision required—smaller aperture angles may also be used to set a side wall angle with the aid of a local chemical reaction.

The at least one massive particle beam can comprise at least one element from the group of: an electron beam, an ion beam, an atom beam, and a molecule beam.

A photolithographic mask may comprise a transmitting photomask and a reflecting photomask. A photolithographic mask may comprise a binary photomask or a phase-shifting photomask. Further, the photolithographic mask may comprise a mask for a multiple exposure.

Typically, a photolithographic mask comprises a substrate with structure elements or pattern elements arranged thereon or with pattern elements etched into the substrate. In this application, the surface of the photolithographic mask is understood to mean a region of a surface of a photomask, said region having no structure elements that image the incident light.

A computer program may comprise instructions which, when executed by a computer system, cause the computer system to carry out the method steps according to one of the aspects of setting at least one side wall angle.

A computer program may comprise instructions which, when executed by a computer system, cause the computer system to carry out the method steps according to one of the aspects of examining the at least one defect.

In one embodiment, the apparatus for setting at least one side wall angle of at least one pattern element of a photolithographic mask comprises: (a) at least one gas provision system which is embodied to provide at least one precursor gas; (b) at least one particle beam source which is embodied to generate at least one massive particle beam, wherein the at least one massive particle beam is embodied to induce a local chemical reaction of the at least one precursor gas; and (c) at least one adjustment unit which is embodied to alter at least one parameter of the at least one particle beam source and/or at least one process parameter during the local chemical reaction in order to set the at least one side wall angle of the at least one pattern element.

The adjustment unit can further be embodied to obtain at least one element of the group of:
  measurement data of at least one defect, which were recorded at different angles of incidence,
  data of a three-dimensional contour of at least one defect,
  parameters of a repair shape of at least one defect,
  data of a defect residue of at least one defect,
  a side wall angle of at least one pattern element; and
  an angle of a generated side wall.

The at least one gas provision system can be embodied to provide the at least one precursor gas with a specified gas mass flow, at a specified temperature and/or in a specified precursor gas composition. The gas provision system can comprise at least one element from the group of: at least one supply container, which is embodied to store the at least one precursor gas, at least one control valve, which is embodied to control a gas mass flow of the at least one precursor gas, at least one gas feedline system, which is embodied to guide the at least one precursor gas from the at least one supply container to a point of incidence of the massive particle beam on the photolithographic mask, and at least one nozzle, which is embodied to concentrate the precursor gas at the point of incidence of the massive particle beam on the surface of the photolithographic mask.

The at least one precursor gas may comprise at least one element from the group of: at least one etching gas, at least one deposition gas and at least one additive gas.

The at least one etching gas may comprise at least one halogen-containing compound. A halogen-containing compound may comprise at least one element from the group of: Fluorine ($F_2$), chlorine ($Cl_2$), bromine ($Br_2$), iodine ($I_2$), xenon difluoride ($XeF_2$), xenon tetrafluoride ($XeF_4$), xenon hexafluoride ($XeF_6$), xenon chloride (XeCl), hydrogen fluoride (HF), argon fluoride (ArF), krypton fluoride (KrF), sulfur difluoride ($SF_2$), sulfur tetrafluoride ($SF_4$), sulfur hexafluoride ($SF_6$), phosphorus trifluoride ($PF_3$), and phosphorus pentafluoride ($PF_5$), and nitrosyl chloride (NOCl).

The at least one deposition gas may comprise at least one element from the group of: a metal alkyl, a transition element alkyl, a main group alkyl, a metal carbonyl, a transition element carbonyl, a main group carbonyl, a metal alkoxide, a transition element alkoxide, a main group alkoxide, a metal complex, a transition element complex, a main group complex and an organic compound.

The metal alkyl, the transition element alkyl and the main group alkyl may comprise at least one element from the group of: cyclopentadienyl (Cp) trimethyl platinum ($CpPtMe_3$), methylcyclopentadienyl (MeCp) trimethyl platinum ($MeCpPtMe_3$), tetramethyltin ($SnMe_4$), trimethylgallium ($GaMe_3$), ferrocene ($Cp_2Fe$) and bisarylchromium ($Ar_2Cr$).

The metal carbonyl, the transition element carbonyl and the main group carbonyl may comprise at least one element from the group of: chromium hexacarbonyl ($Cr(CO)_6$), molybdenum hexacarbonyl ($Mo(CO)_6$), tungsten hexacarbonyl ($W(CO)_6$), dicobalt octacarbonyl ($Co_2(CO)_8$), triruthenium docadecarbonyl ($Ru_3(CO)_{12}$) and iron pentacarbonyl ($Fe(CO)_5$).

The metal alkoxide, the transition element alkoxide and the main group alkoxide may comprise at least one element from the group of: tetraethyl orthosilicate (TEOS, $Si(OC_2H_5)_4$) and tetraisopropoxytitanium ($Ti(OC_3H_7)_4$). The metal halide, the transition element halide and the main group halide may comprise at least one element from the group of: tungsten hexafluoride ($WF_6$), tungsten hexachloride ($WCl_6$), titanium hexachloride ($TiCl_6$), boron trichloride ($BCl_3$) and silicon tetrachloride ($SiCl_4$).

The metal complex, the transition element complex and the main group complex may comprise at least one element from the group of: copper bis(hexafluoroacetylacetonate) ($Cu(C_5F_6HO_2)_2$) and dimethylgold trifluoroacetylacetonate ($Me_2Au(C_5F_3H_4O_2)$).

The organic compound may comprise at least one element from the group of: carbon monoxide (CO), carbon dioxide ($CO_2$), an aliphatic hydrocarbon, an aromatic hydrocarbon, a constituent of vacuum pump oils and a volatile organic compound.

The at least one additive gas may comprise at least one element from the group of: an oxidation agent, a halide and a reducing agent.

The oxidation agent may comprise at least one element from the group of: oxygen ($O_2$), ozone ($O_3$), water vapor ($H_2O$), hydrogen peroxide ($H_2O_2$), dinitrogen oxide ($N_2O$), nitrogen oxide (NO), nitrogen dioxide ($NO_2$) and nitric acid ($HNO_3$). The halide may comprise at least one element from the group of: chlorine ($Cl_2$), hydrochloric acid (HCl), xenon difluoride ($XeF_2$), hydrogen fluoride (HF), iodine ($I_2$), hydrogen iodide (HI), bromine ($Br_2$), hydrogen bromide (HBr), nitrosyl chloride (NOCl), phosphorus trichloride ($PCl_3$), phosphorus pentachloride ($PCl_5$) and phosphorus trifluoride ($PF_3$). The reducing agent may comprise at least one element from the group of: hydrogen ($H_2$), ammonia ($NH_3$) and methane ($CH_4$).

Moreover, the apparatus for setting a side wall angle of at least one pattern element of a photolithographic mask can be embodied to carry out the steps of the above-defined method for setting a side wall angle of at least one pattern element of a photolithographic mask.

In a second embodiment, the apparatus for examining at least one defect of a photolithographic mask using at least one massive particle beam at different angles comprises: (a) at least one particle beam source which is embodied to generate at least one massive particle beam; and (b) at least one adjustment unit which is embodied to alter an angle of incidence of the massive particle beam during the examination.

The adjustment unit can further be embodied to control the change of the mean angle of incidence of the particle beam on the at least one defect of the photolithographic mask. Furthermore, the adjustment unit can be embodied to change or vary a condenser aperture. This may be done by exchanging the condenser aperture (or simply the aperture). As a result, the adjustment unit can vary the aperture angle and the focus spot of the massive particle beam.

Moreover, for the lower aperture angle range (for example an aperture angle range of approximately 0.5° to 2.0°), the adjustment unit can be embodied to vary the mean angle of incidence of the particle beam on the at least one defect of the photolithographic mask with respect to the normal of a sample surface which exceeds the aperture angle by a factor of 2, preferably by a factor of 5, more preferably by a factor of 10, and most preferably by a factor of 20.

The adjustment unit can comprise at least one element from the group of: an electrical deflection system and a magnetic deflection system.

The electrical deflection system can be part of the particle beam source; in particular, the electrical deflection system can be part of the imaging system of the particle beam source. The magnetic deflection system might not be part of the particle beam source. This means the magnetic deflection system can be arranged outside of the imaging system of the particle beam source.

However, both the electrical and magnetic deflection system might also be part of the particle beam source of the massive particle beam. Thus, for example, the electrical deflection system can be arranged upstream of an electron optical lens of the imaging system of the particle beam source and the magnetic deflection system can be arranged downstream of an electron optical lens of the imaging system of the particle beam source.

The electrical deflection system can comprise at least one deflection plate pair. The electrical deflection system can comprise at least two deflection plate pairs, which are arranged parallel to one another. The electrical deflection system can be arranged upstream of an electron optical objective lens of the imaging system of the particle beam source for the massive particle beam.

The magnetic deflection system can comprise at least one coil pair. However, the magnetic deflection system can also comprise at least one permanent magnet.

The examining apparatus and/or the apparatus for setting a side wall angle can further comprise: at least one sample stage which is embodied to rotate a photolithographic mask about an axis perpendicular to the patterned surface of the photolithographic mask. The at least one sample stage can further be embodied to rotate a photolithographic mask through an angle perpendicular to the patterned sample surface normal. The adjustment unit can further be embodied for open-loop or closed-loop control of the rotation of the sample stage.

When considered in spherical coordinates and under the assumption that the optical axis of the photolithographic mask is parallel to the z-axis of a coordinate system in spherical coordinates, the at least one sample stage is embodied to change a polar angle between the particle beam and the optical axis. By virtue of the at least one sample stage also facilitating a change in the azimuth angle in addition to a change in the polar angle, improved processing of the photolithographic mask by use of a local chemical reaction can be carried out at any site or on any side of a pattern element of the photomask.

The imaging system of the particle beam source can be embodied to be rotatable about an axis perpendicular to the normal of the patterned surface of a photolithographic mask. The adjustment unit can further be embodied for open-loop or closed-loop control of the rotation of the imaging system. Further, the particle beam source can be embodied to be rotatable about an axis perpendicular to the normal of the patterned surface of a photolithographic mask. Moreover, the adjustment unit can be embodied for open-loop or closed-loop control of the rotation of the particle beam source. Moreover, the adjustment unit can be embodied for open-loop or closed-loop control of both the sample stage and the imaging system or the particle beam source for the purposes of altering an angle of incidence.

The at least one sample stage can be rotatable about a third axis, wherein the third axis of rotation of the sample stage is substantially perpendicular to the normal of the patterned surface of the photolithographic mask. It is advantageous if the third axis of rotation is also perpendicular to the second axis of rotation of the sample stage such that three axes of rotation of the sample stage span a rectangular coordinate system.

A combination of changing the mean angle of incidence of the massive particle beam on the surface of the photolithographic mask, which reduces the mean angle of incidence in one direction, and of a sample stage that is rotatable about the optical axis of the photolithographic masks allows the mean angle of incidence of the massive particle beam to be set in two spatial directions. This facilitates access to any processing location on the photolithographic mask. This allows any desired side wall angle of a pattern element of a photolithographic mask to be set.

Further, the adjustment unit can be embodied to deflect the massive particle beam in two directions. The two deflection directions of the adjustment unit can set at an angle of substantially 90° with respect to one another.

The examining apparatus and/or the apparatus for setting a side wall angle of at least one pattern element of a photolithographic mask can moreover comprise at least one detector, which is embodied to detect the particles originating from the photolithographic mask, which particles are caused by the massive particle beam. The particles originating from the photolithographic mask might comprise the particle type of the massive particle beam. The particles originating from the photolithographic mask might differ from the particle type of the massive particle beam.

The examining apparatus and/or the apparatus for setting a side wall angle can further comprise: an evaluation unit which is embodied to analyze the data of the at least one defect, which were recorded at different angles of incidence.

The evaluation unit can further be embodied to generate a three-dimensional contour of the at least one defect from the data recorded at different angles of incidence. In particular, the evaluation unit can generate image data from the scan data of the massive particle beam. The image data can be stored and/or can be displayed on a monitor of the apparatus for examining at least one defect and/or of the apparatus for setting a side wall angle.

Further, the evaluation unit can be embodied to determine at least one change in the mean angle of incidence of the massive particle beam on the surface of the photolithographic mask from the analyzed scan data.

Furthermore, the evaluation unit can be embodied to determine a change to be set in the mean angle of incidence of the massive particle beam from the kinetic energy of the particle beam for carrying out the local chemical reaction. Moreover, the evaluation unit can be embodied to determine the change to be set in the mean angle of incidence of the massive particle beam from a material composition of the local chemical reaction.

The kinetic energy of the particles of the massive particle beam and the material composition on which the particles of the particle beam strike influence the size of the interaction region of the particle beam with the photolithographic mask and hence influence the area of the mask that might be impaired by carrying out a local chemical reaction.

The evaluation unit can be further embodied to determine an area and a material composition for a locally restricted protective layer around a processing site of a defect or of a processing site for setting an edge slope.

A locally restricted protective layer can be deposited on the substrate of a photomask around a defect before a local chemical reaction is carried out in order to protect the mask substrate from damage during the local chemical reaction. A locally restricted protective layer can be removed from the substrate again with the aid of an EBIE process after the local chemical reaction has finished. Alternatively, a protective layer can be removed from the mask again by use of a mask cleaning step.

Further, the evaluation unit can be embodied to determine at least one change to be set in the angle of incidence of the massive particle beam on the photolithographic mask from the analyzed data.

Moreover, the evaluation unit can be embodied to ascertain the parameters of a repair shape from the analyzed data.

The examining apparatus can transmit the measurement data to the apparatus for setting a side wall angle and the apparatus for setting the side wall angle or its evaluation unit can ascertain the parameters of a repair shape for removing the defect and/or for setting the demanded edge slope of one or more pattern elements of the examined mask. However, it is also possible that the examining apparatus or the evaluation unit thereof calculates a parameterized repair shape for repairing the defect and/or for setting the edge slope of one or more side walls of one or more pattern elements from the measurement data recorded at different angles and transmits the parameterized repair shape to the apparatus for setting a side wall angle.

Further, both the examining apparatus and the apparatus for setting a side wall angle can contain an evaluation unit. Alternatively, it is also possible that an evaluation unit is divided among an examining apparatus and an apparatus for setting a side wall angle. The examining apparatus and the apparatus for setting a side wall angle can communicate via a wireless or a wired interface.

Moreover, it is possible that the examining apparatus and the apparatus for setting a side wall angle are integrated in a single apparatus.

The adjustment unit can further be embodied to control the change of the angle of incidence of the massive particle beam on the at least one pattern element of the photolithographic mask on the basis of a parameterized repair shape.

Moreover, the adjustment unit can be embodied to carry out a change in at least one parameter of the at least one massive particle beam, of a process parameter, and/or a change in the angle of incidence of the massive particle beam in automated form.

Finally, the apparatus for examining at least one defect of a photolithographic mask can be embodied to carry out the steps of the above-defined method for examining at least one defect of a photolithographic mask.

BRIEF DESCRIPTION OF DRAWINGS

The detailed description that follows describes currently preferred working examples of the invention with reference to the drawings, wherein:

FIG. 1 depicts, in the upper partial image, a schematic section of an edge of a pattern element of a photolithographic mask as predetermined by the design and reproduces, in the lower partial image, an edge of the pattern element of the upper partial image, produced without defects;

FIG. 9 reproduces the lower partial image of FIG. 1 in the upper partial image, wherein a particle beam with an aperture angle $\beta$ is incident on the photolithographic mask, and illustrates the intensity distribution in the focus of the particle beam of the upper partial image of FIG. 9 in the lower partial image;

FIG. 13 presents a magnified detail of the apparatus from FIG. 12 with a deflection system in the form of a magnetic deflection system at the output of a column of a scanning electron microscope;

FIG. 14 reproduces a magnified detail of the apparatus from FIG. 12 with a deflection system in the form of an electrical deflection system at the sample-side end of the column of the scanning particle microscope;

FIG. 22 schematically illustrates the impact of an electron beam with a large aperture angle, which has been deflected from the optical axis, on a side wall of a pattern element;

DETAILED DESCRIPTION

Figure 2A:
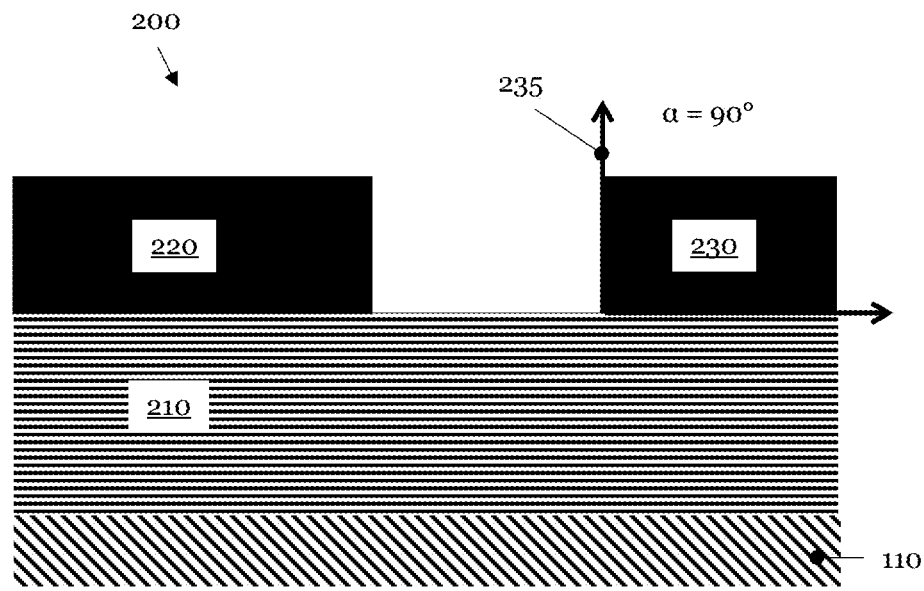
FIG. 2A shows a schematic section through a mask for the extreme ultraviolet (EUV) wavelength range, the pattern elements of which have edge slopes of $\alpha=90°$.

Currently preferred embodiments of a method according to the invention and of an apparatus according to the invention for setting a side wall angle of a pattern element of a photolithographic mask are explained in more detail below. Further, exemplary embodiments of a method according to the invention and an apparatus according to the invention for examining a defect of a photomask are explained in detail below. The methods according to the invention are described using the example of a photomask for the extreme ultraviolet (EUV) wavelength range. However, they are not restricted to improving the imaging behavior of EUV masks. Rather, they can be used to correct any type of defect of photomasks and set the side wall angles or edge slopes of pattern elements of any type of photomask.

Hereinafter, the term mask or photomask should also comprise a template for nanoimprint lithography (NIL).

The apparatuses according to the invention for setting a side wall angle of a pattern element and/or for examining a defect of a photolithographic mask are explained using the example of a modified scanning electron microscope. However, the apparatuses according to the invention are able to be realized not only on the basis of a scanning electron microscope. Rather, apparatuses according to the invention can be based on any scanning particle microscope, i.e., an apparatus as defined in this application can use any type of massive particle for examining and/or processing a photomask. Further, apparatuses according to the invention and the use of methods according to the invention are not restricted to processing of photolithographic masks only. Rather, the apparatuses and methods explained here can be used for analyzing and/or for processing various microstructured components. Examples to this end include wafers, ICs (integrated circuits), MEMSs (micro-electromechanical systems) and PICs (photonic integrated circuits).

The upper partial image 105 in FIG. 1 schematically shows a section through a detail of a photolithographic mask 100. The mask 100 can be a transmitting or a reflecting mask 100. In the example of FIG. 1, the photomask 100 comprises a substrate 110 and a pattern element 120 or a structure element 120. The substrate 110 can comprise a quartz substrate and/or a material with a low coefficient of thermal expansion (LTE (low thermal expansion) substrate). The pattern element 120 can be a structure element 120 of a binary photomask 100. In this case, the pattern element 120 may comprise an element of an absorber structure 120 and may include chromium, for example. However, the pattern element 120 could also comprise a structure element 120 of a phase-shifting photomask 100. By way of example, a phase-shifting mask 100 can be produced by etching an appropriate pattern into the substrate 110 of the mask 100. Further, the pattern element 120 might comprise a structure element 120, which displaces the phase of the actinic radiation relative to the radiation incident on the substrate 110 and also absorbs some of the light at the actinic wavelength that is incident on the pattern element 120. Examples of this include OMOG (opaque MoSi (molybdenum silicide) on glass) masks.

The upper partial image 105 in FIG. 1 shows an ideal edge 130, as predetermined by the design, or a section through a side wall 130. The edge 130 of the pattern element 120 is determined by the edge slope 140 or the side-wall wall angle 140. Further, the edge 130 or the side wall 130 is characterized by the radii 135 and 145 or the radii of curvature 135 and 145, by means of which the side wall 130 merges, firstly, into the surface 115 of the substrate 110 of the mask 100 and, secondly, into the plane surface 125 of the pattern element 120. Typically, the design prescribes an edge slope 140 or a side wall angle 140 of substantially $\alpha=90°$. The radii of curvature 135 and 145 of the edges 130 or of the side walls 130 of the pattern elements 120 should be as small as possible, i.e., lie as close to zero as possible.

The lower partial image 155 in FIG. 1 presents a section through a pattern element 120 produced as per the design prescriptions discussed above on the substrate 110 of the photomask 150. The edge slope 170 or the side wall angle 170 of the side wall 160 or of the edge 160 is substantially $\alpha=90°$ and consequently exhibits good correspondence with the prescription of the design. The radii of curvature 165 and 175 of the side wall 160 are not zero but are so small that the pattern element 120 carries out its function. This means that a photolithographic mask 100 whose structure elements 120 have side walls 160 or edges 160 with the side wall angle 170 as depicted in the lower partial image 155 of FIG. 1 meets the specification.

FIG. 2A shows a schematic section through a part of a photolithographic mask 200 for the EUV wavelength range. A many layer structure 210 or multilayer structure 210 is applied on the substrate 110 thereof. By way of example, the multilayer structure can have 20 to 60 alternating layers made of molybdenum (Mo) and Silicon (Si). Two structure or pattern elements 220 and 230 are deposited on the multilayer structure 210. By way of example, the pattern elements 220, 230 of the EUV mask 200 may comprise tantalum nitride (TaN). A coordinate system 235 which is used to define an edge slope 170 or a side wall angle 170 is plotted in the right pattern element 220. In FIG. 2A, the side wall angle 170 of the two pattern elements 220, 230 substantially has a value of $\alpha=90°$.

Figure 2B:
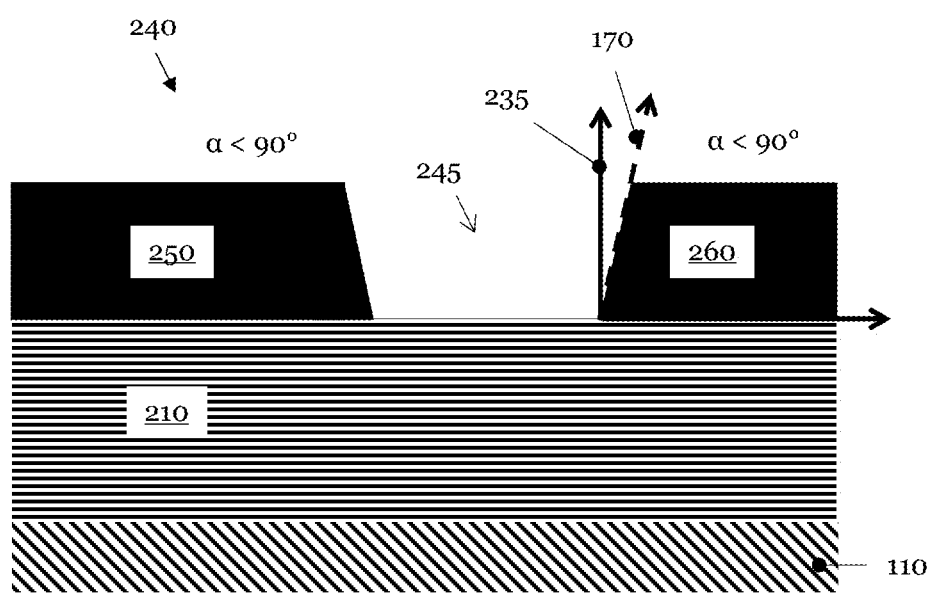
FIG. 2B reproduces the section of the EUV mask of FIG. 2A, wherein the side wall angles (SWA) of the pattern elements open upwards, i.e., $\alpha<90°$.

FIG. 2B elucidates a detail of an EUV mask 240 which has a similar structure to the EUV mask 200 of FIG. 2A. In contrast to the EUV mask 200 of FIG. 2A, the pattern elements 250 and 260 have edge slopes 170 that deviate from 90°. The pattern elements 250 and 260 open upward and, as elucidated by the coordinate system 235, have a side wall angle 170 of less than 90°. The opening 245 formed by the pattern elements 250 and 260 becomes larger in the upward direction.

Figure 2C:
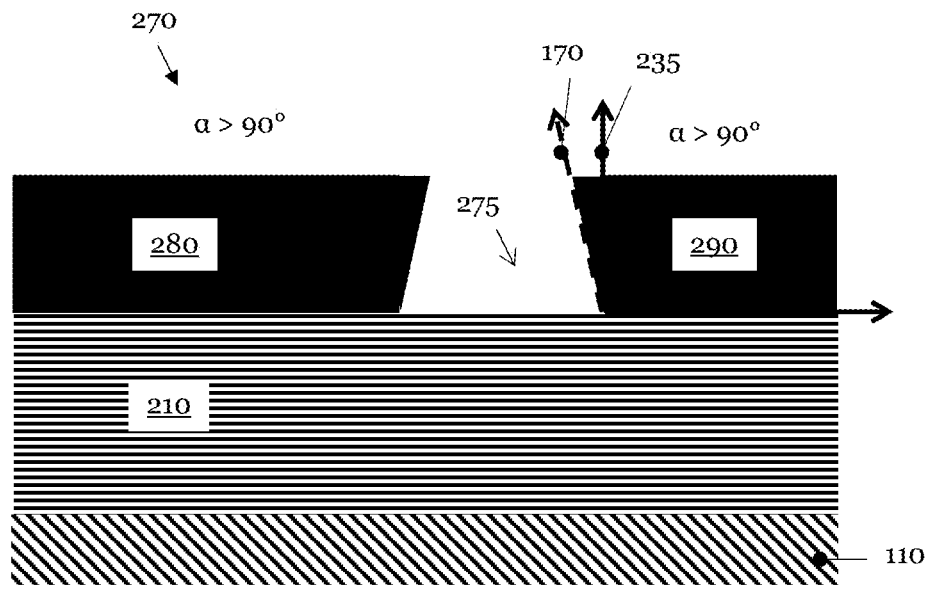
FIG. 2C presents the section of the EUV mask of FIG. 2A, wherein the pattern elements have an undercut, i.e., $\alpha>90°$.

FIG. 2C presents a detail of an EUV mask 270, the pattern elements 280 and 290 of which have an undercut, i.e., the opening 275 tapers in the upward direction. This configuration is characterized by a side wall angle $\alpha>90°$.

Figure 3:
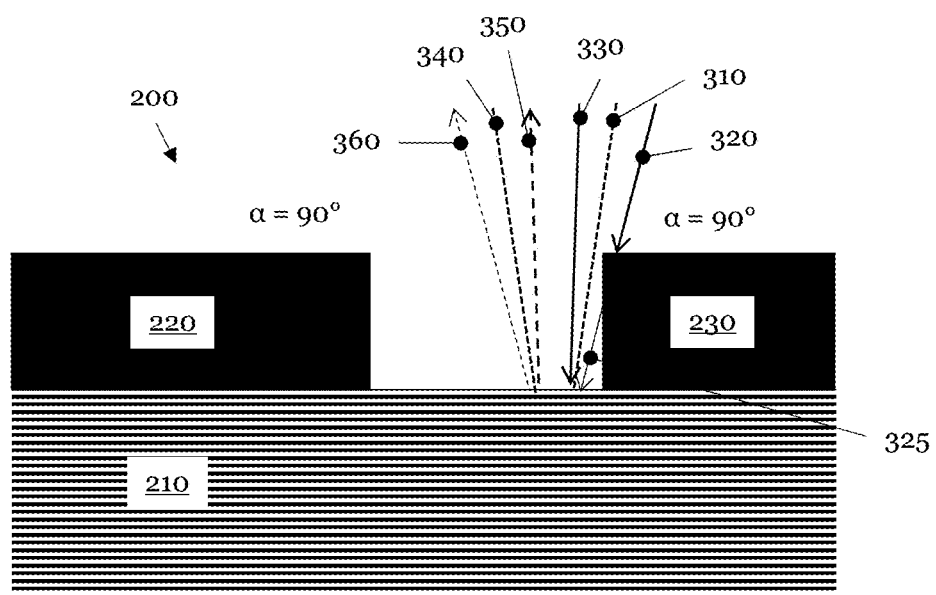
FIG. 3 schematically elucidates the impact of EUV radiation on the EUV mask of the partial image of FIG. 2A and the reflection thereof.

FIG. 3 schematically illustrates the exposure of the EUV mask detail 200 of FIG. 2A using light at the actinic wavelength. Since the EUV mask 200 is embodied as a reflecting mask 200, it is illuminated at an angle$\neq 0°$. Currently, the chief ray angle 310 (CRA) has a deviation from the normal of the EUV mask 200 ranging from 5° to 6°. In the examples illustrated in FIG. 3—like in the subsequent FIGS. 4 and 5—the EUV masks are exposed using dipole radiation. This is symbolized by the two beams 320 and 330 that are incident on the mask 200. The beam 320 is partly shadowed or absorbed by the pattern element 230 and strikes the multilayer structure 220 of the EUV mask 200 as a beam of reduced intensity 325. The beam 325 is reflected by the multilayer structure 220 as an EUV light beam 360 whereas the light beam 330 is reflected as beam 350. The reflected CRA 310 is reproduced using the reference sign 340 in FIG. 3. The partial shadowing of the light beam 320 by the pattern element 230 results in a loss of contrast in the case of lithographic imaging through the EUV mask 200. To keep this problem as small as possible, the thickness of the absorbing pattern elements 220, 230 of EUV masks 200 is chosen to be as small as possible. Typical thicknesses of the pattern elements 220, 230 are less than 50 nm.

Figure 4:
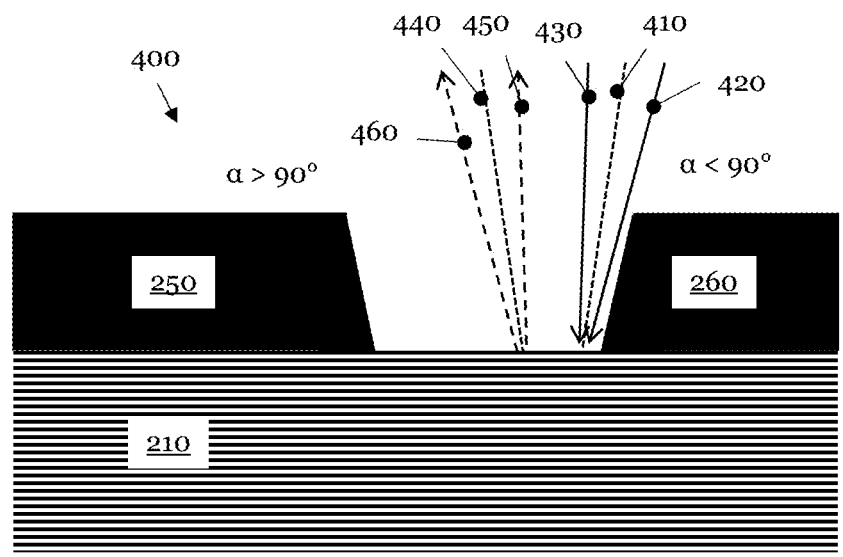
FIG. 4 schematically illustrates the incidence of EUV radiation on the EUV mask of the partial image of FIG. 2B and the reflection thereof through the multilayer structure of the EUV mask.

FIG. 4 schematically depicts the exposure of the EUV mask detail 240 of FIG. 2B likewise using light at the actinic wavelength. As explained in the context of FIG. 3, the illumination is implemented at an angle of the CRA 410 of 5°. Unlike in FIG. 3, the beam 420 can be incident on the multilayer structure 210 without impediment on account of the side wall angle 170 $\alpha<90°$ of the pattern elements 250 and 260. Due to this, the two incident light beams 420 and 430 are reflected with the same intensity as EUV beams 450 and 460, as a result of which it is possible to avoid a loss of contrast when imaging the EUV mask 240.

Figure 5:
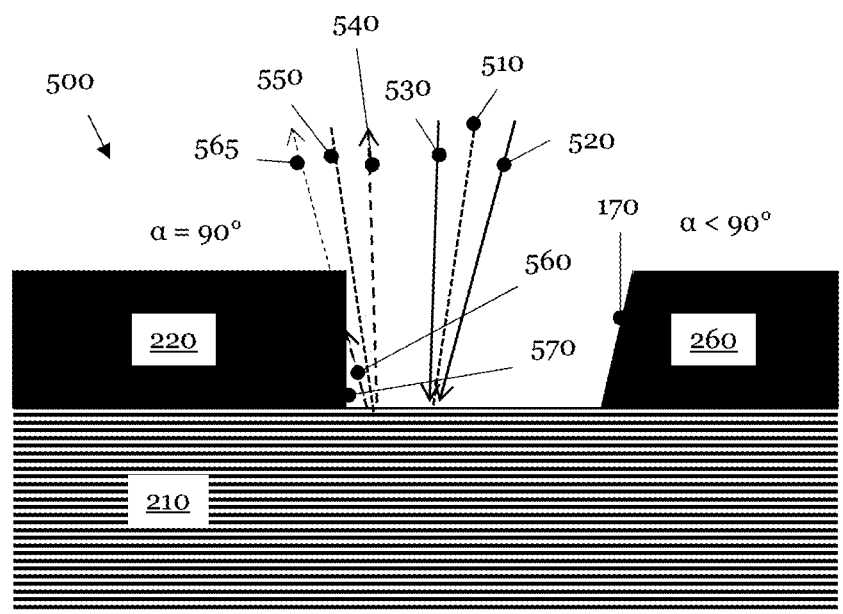
FIG. 5 schematically illustrates the impact of EUV radiation on an EUV mask with an open pattern element ($\alpha<90°$) and a pattern element with an edge slope of $\alpha=90°$.

FIG. 5 shows a detail of an EUV mask 500, in which the left pattern element 220 has an edge slope 170 of $\alpha=90°$. By contrast, the right pattern element 260 has a side wall angle 170 α<90°. An advantage of this edge slope 170 in the case of non-perpendicular incidence is described in the context of FIG. 4. The light beams 520 and 530 of a dipole radiation source are incident in turn on the multilayer structure 210 of the EUV mask 500. As elucidated by the arrow 560 in FIG. 5, some of the EUV radiation that was reflected by the multilayer structure 210 is absorbed by the pattern element 220. Another part is reflected by the side wall 570 of the pattern element 220 and forms an interference pattern (not illustrated in FIG. 5) in the vicinity of the side wall 570 of the pattern element 220.

As a result of the reflection of the side wall 570 with a side wall angle of α=90°, some of the EUV radiation reflected by the multilayer structure 210 is redistributed. Depending on the respective application, this redistribution may be advantageous and have a positive influence on the imaging behavior of the EUV mask 500. This means that an EUV mask 500 whose pattern elements 220, 260 have asymmetric side wall angles 170 can in principle lead to a distribution, adjustable by the edge slope 170, of the radiation 540, 565 reflected by the EUV mask 500 and as a result cause a desired effect.

Figure 6:
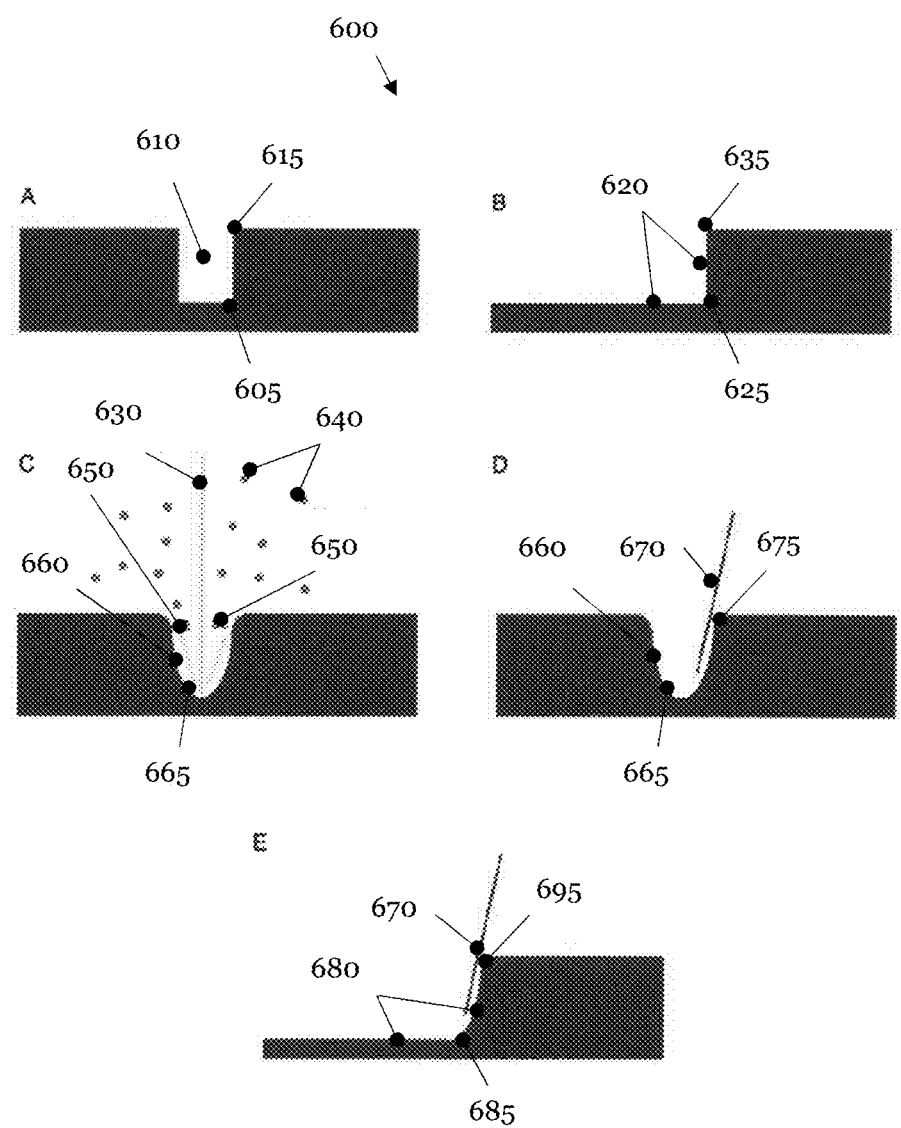
FIG. 6 A: presents a schematic section through an ideal cutout of a photomask, B: shows an ideal edge of a photomask, C: schematically elucidates an electron beam-induced etching (EBIE) process, D: reproduces a real cutout generated by use of an EBIE process, and E: depicts a real edge generated by use of an EBIE process.

In partial image A, FIG. 6 illustrates the generation of a rectangular profile 610 in a photolithographic mask 600, as specified by the design of the mask 600, by use of an exemplary EBIE (electron beam induced etching) process. By way of example, the rectangular profile 610 can be generated in a substrate 110, in a multilayer structure 210 or in a pattern element 220, 230, 250, 260, 280, 290. The radii of curvature 605 and 615 of the rectangular profile 600 have a very small numerical value. Partial image B of FIG. 6 reproduces an ideal edge 620 which was etched into the photomask 600. The radii of curvature 625 and 635 of the ideal edge 620 likewise have very small values and come very close to an ideal radius of curvature of zero.

Partial image C of FIG. 6 schematically depicts the implementation of an EBIE process for generating the rectangular profile 610 of partial image A of FIG. 6, which was specified by the design. A precursor gas in the form of an etching gas 640 is provided in the region of the profile 610 to be generated. A focused electron beam 630 or secondary electrons 650 released from the material of the photomask 600 by the focused electron beam 630 induce the EBIE process by virtue of decomposing the molecules of the etching gas and thus producing at least a reactive type of particles. These reactive particles react with the material of the photomask 600.

Even though the electron beam 630 is periodically scanned over the base area of the profile, the real EBIE process as reproduced in partial image D of FIG. 6 does not generate the rectangular profile 610 specified by the design but instead generates a profile 660 that is closer to having the shape of a trough. The edge slope 670 or the side wall angle 670 deviates significantly from the side wall angle α=90° demanded by the design. Moreover, the radii of curvature 665 and 675 of the trough generated have significantly larger numerical values than the radii of curvature 605 and 615 of the rectangular profile 610.

Partial image E presents a real edge 680 generated by use of an EBIE process. The edge slope 670 of the etched edge 680 is significantly smaller than the side wall angle of α=90° as specified by the design. Furthermore, the actually generated radii of curvature 685 and 695 have substantially larger numerical values than the radii of curvature 625 and 635 of the ideal edge 620 as specified in partial image B.

As specified in partial image C of FIG. 6, the electron beam 630 strikes the photolithographic mask 600 at right angles. At least some of the drawbacks as elucidated in partial images D and E when carrying out an EBIE process can be traced back to the perpendicular incidence of the electron beam 640 on the photomask 600.

Figure 7:
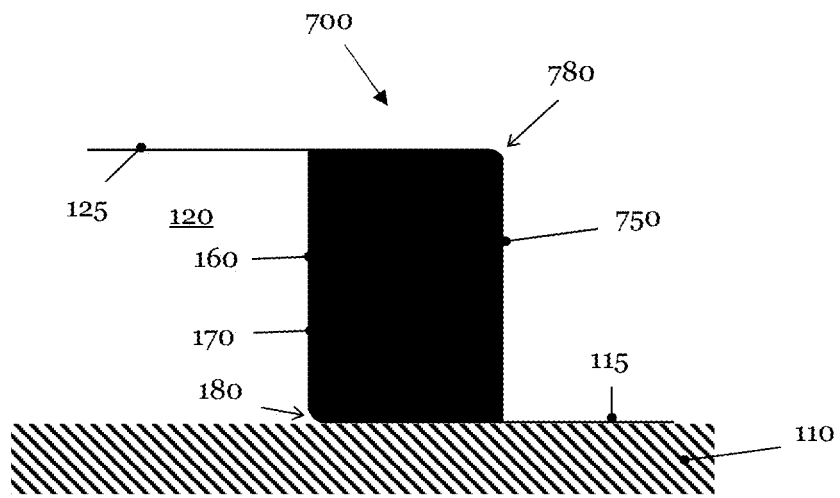
FIG. 7 shows a schematic section of an edge of a pattern element of a photolithographic mask that has a defect in the form of excess material.

FIG. 7 shows a schematic section through a photolithographic mask 700 comprising a substrate 110 and a pattern element 120, which has excess material 750 at the edge 160 or the side wall 160. The excess material 750 may comprise material of an absorbing or phase-shifting pattern element 120 or material of the substrate 110. However, the defect of excess material 750 may also be a particle that has settled at the edge 160 of the pattern element 120. Excess material 750 in the form of a particle typically has a material composition that differs from that of the photomask 700.

In the example reproduced in FIG. 7, the defect of excess material 750 has the same height as the pattern element 120. However, this is no precondition for the application of a method as described in this application or a described apparatus for examining the defect 750 and/or for processing the excess material 750 of the defect or for setting a side wall angle 170, 670. Rather, the apparatuses explained below can examine and/or process defects of the lacking and/or excess material 750 that have virtually any form.

Figure 8:
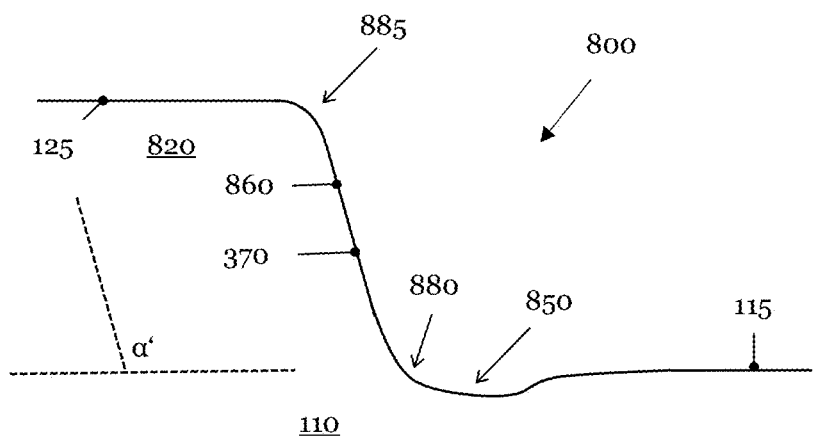
FIG. 8 presents a schematic section of the edge of the pattern element from FIG. 7 after carrying out a local chemical reaction or a local repair process, according to the prior art, for removing the defect.

FIG. 8 presents the section through the detail of the mask 700 from FIG. 7 after the excess material 750 or the defect of excess material 750 has been removed with the aid of a local particle beam-induced etching process, for instance an EBIE process according to the prior art. What can be gathered from the repaired photomask detail 800 presented in FIG. 8 is that the side wall angle α' of the side wall 870 that has arisen as a result of the local etching process deviates significantly from the angle α=90° demanded by the design. Further, the radii of curvature 880, 885 of the side wall 860 of the generated pattern element 820 have been greatly increased in relation to the example specified in the lower partial image 155 of FIG. 1. Moreover, a part 850 of the substrate 110 of the mask 700 in and around the region previously covered by the excess material 750 has been removed by the local etching process. As a consequence of the explained disadvantageous effects of the local etching process, the repaired mask 800 still does not always meet the imaging specification specified for the photomask.

FIG. 8 was used above to explain the difficulties when processing a defect of excess material 750 by carrying out a particle beam-induced local etching process. A second class of frequently occurring defects of photolithographic masks are defects of missing material, for instance missing absorber material in the case of binary masks (not depicted in FIG. 8). Like in the case of local etching, edge slopes of the side walls of the deposited pattern elements that deviate significantly from 90° are generated within the scope of the local deposition of missing material, for instance missing absorber material, with the aid of a particle beam-induced deposition process, for instance an EBID (electron beam induced deposition) process. Moreover, it is not possible to influence the side walls forming during the repair or it is only possible to influence these to a very small extent. Moreover, the radii of curvature of the deposited pattern elements are frequently also significantly larger than the radii of curvature 165, 175 of pattern elements 120 generated in the original production process of the defect-free mask 150. Moreover, on account of the local deposition process, there is an unwanted material accumulation on parts of the surface 115 of the substrate 110 that should be free from deposited material or parts of the substrate 110 are etched in undesired fashion.

This means that the local deposition process generates a type of halo around the local processing site. The material additionally deposited on parts of the surface 115 of the substrate 110 and the above-described deficiencies of a local EBID process usually have as a consequence a local impairment of the functionality of a repaired photolithographic mask.

At least some of the causes leading to the problems discussed above in the context of FIG. 8 are explained below on the basis of FIGS. 9 and 10.

The upper partial image 905 of FIG. 9 reproduces the detail of the lower partial image of the photolithographic mask 150 from FIG. 1. A particle beam 910 having an aperture angle β strikes the substrate 110 of the mask 150. The aperture angle β can comprise an angular range from fractions of a degree to a few degrees. The particle beam 910 strikes the surface 115 of the substrate 110 of the mask 150 in substantially perpendicular fashion.

The aperture angle β is essentially determined by the size of the opening of the condenser aperture of a scanning particle microscope. By selecting an aperture having a respective opening, the aperture angle β of the particle beam 910 can be fixed. However, enlarging the size or the diameter of the aperture may have detrimental effects on the amount of aberrations of the particle beam 910.

The lower partial image 955 of FIG. 9 shows the intensity distribution of the particle beam 910 within its tip 920 or its focus 920 or at the point of incidence of the particle beam 910 on the surface 115 of the substrate 110 of the mask 150 from FIG. 1. Typically, the particle beam 910 has a Gaussian or Gaussian-like intensity profile at its focus 920. The minimum achievable full width at half maximum (FWHM) 950 depends on the particle type of the particle beam 910. Currently, it is possible at the focus to focus electron beams to a spot diameter ranging from the nanometer range to the sub-nanometer range.

So as to obtain a spatial resolution for examining a sample, for instance a defect 750, that is as high as possible, the particle beam 910 must be focused onto a small spot 950 at the examination location. This frequently also applies to the processing of a sample, for example the repairing of a defect 750 and/or the setting of a side wall angle 170, 670 of a pattern element 120 of a photomask 700. Like in the optical range, the requirement of a small spot diameter at the focus however necessitates a large aperture angle β for the particle beam 910. As visualized in the upper partial image 905 of FIG. 9, a large aperture angle β of the particle beam 910 however impairs the ability of the particle beam 910 to access examination, processing and/or repair locations that are located in the vicinity of edges 160 or steep side walls 160 of pattern elements 120.

FIG. 10 once again reproduces the mask detail 150 of FIG. 1, with the particle beam 910 from FIG. 9 additionally being incident on the material of the photolithographic mask 150. In FIG. 10, reference sign 1010 denotes the interaction region that the particle beam 910 generates when incident on the substrate 110 of the photolithographic mask 150. When the particle beam 910 is incident on the substrate 110, the particles of said particle beam, for example electrons, are scattered in the electrostatic field of the atomic nuclei of the substrate material 110. The energy of the incident particles of the particle beam 910 generates secondary products in the interaction volume 1010 or in the scattering cone 1010. By way of example, the scattering processes of the incident particles with the atomic nuclei transfer energy to the lattice of the substrate material 110 of the mask 150, as a result of which the substrate material 110 is heated locally. The electrons of the substrate material 110 may also, by way of scattering processes, absorb energy from the primary particles of the particle beam 910 incident on the substrate 110 at the point 1020 and may be released as secondary electrons and/or as backscattered electrons. The size and the shape of the interaction region 1010 depend on the particle type of the particle beam 910 and on the kinetic energy of the particles of the particle beam 910 incident on the substrate 110. Further, the material or the material composition of the substrate 110 influences the size and the form of the scattering cone 1010.

During a processing process, for instance the repair of a defect 750 and/or the setting of a side wall angle 670, molecules of a precursor gas are adsorbed at the surface 115 of the substrate 110 in the vicinity of a site to be processed. Molecules of a precursor gas that are present in the region of the point of incidence 1020 of the particle beam 910 on the surface 125 of the substrate 110 of the mask 150, 200 are decomposed into their constituent parts by the processes running in the interaction region 1010—for instance, by the absorption of secondary electrons and/or backscattered electrons.

When the particle beam 910 is incident on the substrate 110, the interaction region 1010 or the scattering cone 1010 is located substantially within the substrate 110 of the mask 150. Should the particle beam 910 be incident on the edge 160 or the side wall 160 of the pattern element 120 of the mask 150, only some of the processes running in the interaction region 1010 occur within the material of the pattern element 120 of the mask 150. This is visualized in FIG. 10 by the deformed or substantially halved interaction region 1050. Some of the secondary or backscattered particles 560 that are generated in the deformed interaction region 1050 can leave the interaction region 1050 and reach the surface 115 of the substrate 110 of the mask 100. This is illustrated by the arrows 1060 in FIG. 10. Unlike in the material of the pattern element 120, there are hardly any interaction processes in the vacuum environment in which the mask 150, 200 is typically located during an examination process and/or a processing process.

As already explained above, the surface 125 of the substrate 110 of the mask 150 during a processing process of the photolithographic mask 150 is covered by molecules of the precursor gas 640 in the region of the edge 160 or the side wall 160 of the pattern element 120. The secondary particles 1060 that are released by the particle beam 910 in the deformed interaction region 1050 and incident on the surface 115 of the substrate 110 initiate unwanted local processing processes on the substrate 110. Should the precursor gas 640 be present in the form of an etching gas 640, this is an etching process of the substrate 110 that leads to a local depression 850 in the substrate 110, as indicated in FIG. 8. By contrast, precursor gases present in the form of deposition gases often lead to unwanted local deposition processes in the form of a halo, for example on the substrate 110 of the photolithographic mask 150, 700.

Figure 10:
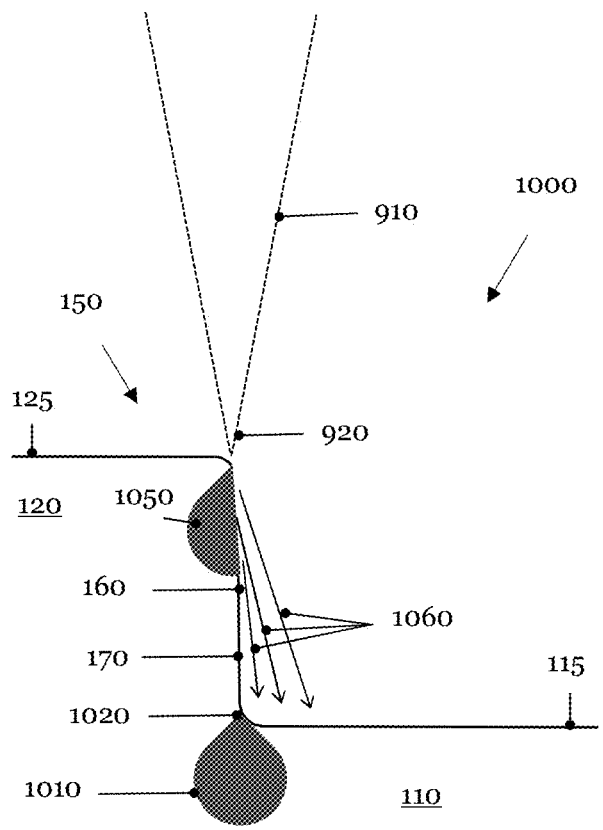
FIG. 10 depicts an interaction region ("scattering cone") of the particle beam from FIG. 9 when processing an edge or a side wall of the pattern element of the photolithographic mask from the lower partial image of FIG. 1 according to the prior art.
Figure 11:
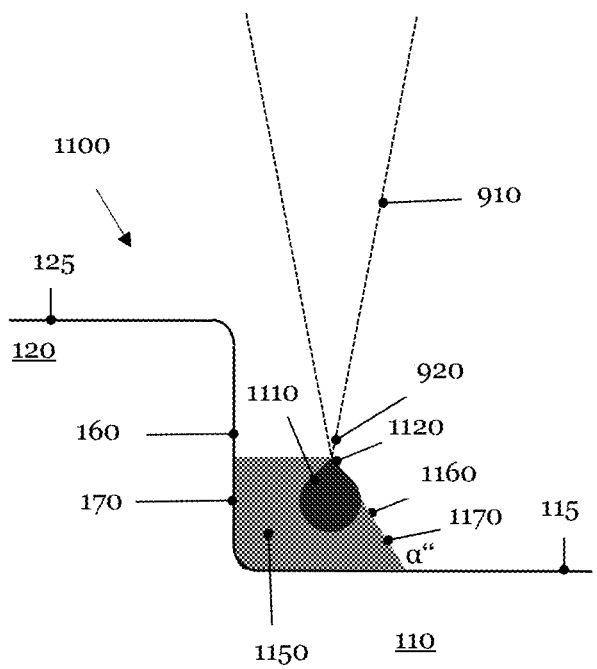
FIG. 11 schematically visualizes a particle beam-induced deposition process according to the prior art being carried out.

Diagram 1100 of FIG. 11 visualizes the correction of a defect of missing material by way of the deposition of material 1150 along the side wall 170 of the pattern element 120 on the substrate 110 of the photolithographic mask 150. FIG. 11 illustrates an EIBD process according to the prior art being carried out. It was explained within the context of FIG. 10 that the electron beam 910 generates an interaction region 1010 in the substrate upon incidence on the surface 115 of the substrate 110 of the mask 150. The processes running in the interaction region 1010 facilitate the splitting of the molecules of a precursor gas 640 which are adsorbed at the surface 115 of the substrate 110. Should the molecules of the precursor gas adsorbed on the surface 115 of the substrate 110 be a deposition gas, a constituent part or a component of the molecules of the deposition gas split by the action of the electron beam 910 can be deposited on the surface 115 of the substrate 110. Thus, for example, a metal carbonyl is split into a metal atom or metal ion and carbon monoxide by the direct action of the electron beam 910. The metal atom may settle on the surface 115 of the substrate 110 while the volatile carbon monoxide molecules can predominantly leave the processing location.

By way of sequentially scanning the focused electron beam 910 over the region of missing material 1150, the missing material is deposited layer-by-layer on the substrate 110 in the presence of the deposition gas. However, the size of the interaction region 1110 generated by the electron beam 910 in the substrate 110 or in the deposit 1150 or deposited material 1150 prevents side walls 170 or edges with a side wall angle 670 of substantially α=90° from being able to be deposited. Instead, the size of the interaction region 1110 at least partly sets the magnitude of the edge slope 1170 α" of the side wall 1160 or of the edge 1160 of the deposit 1150. Like when a local etching process is carried out, the size and the shape of the interaction region 1110 depends on the kinetic energy of the electrons of the electron beam 910 and on the material composition of the deposit 1150. However, neither implementing a local particle beam-induced etching process nor implementing a local particle beam-induced deposition process facilitates setting of a side wall angle 170, 670, 1170.

Figure 12:
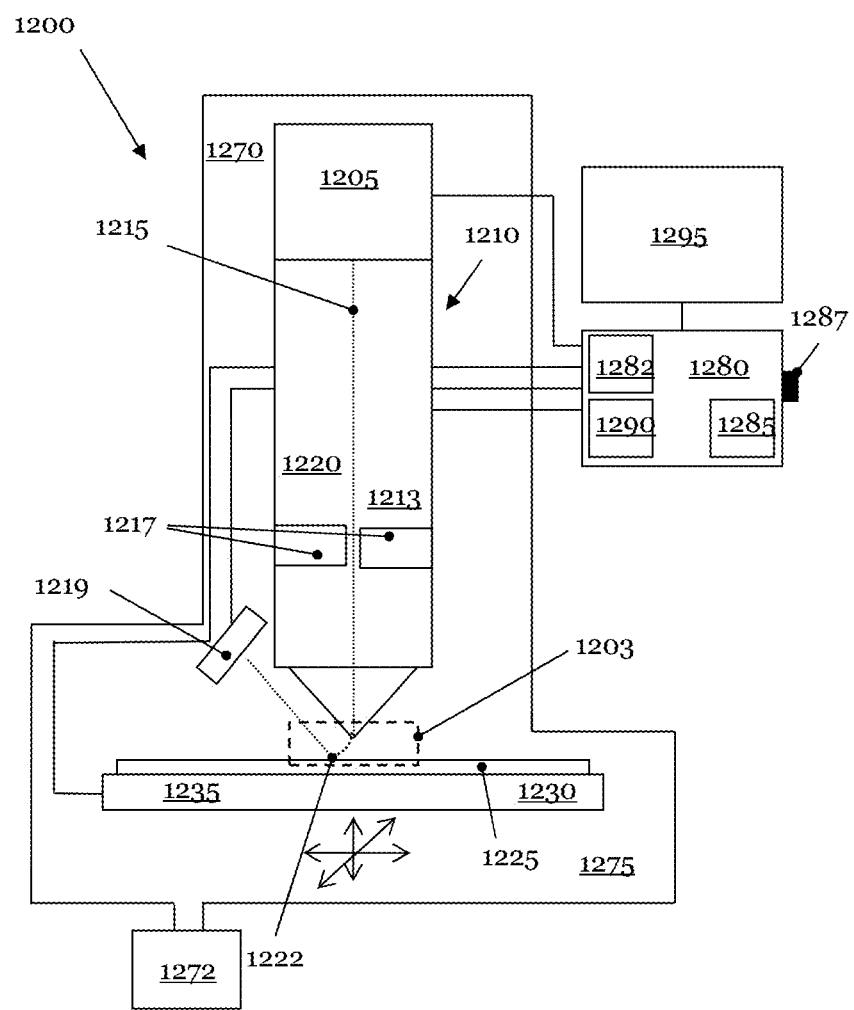
FIG. 12 shows a schematic section through a few components of an apparatus for examining a photolithographic mask.

FIG. 12 shows a schematic section through some important components of an apparatus 1200, which can be used to examine one or more defects 750 of a photolithographic mask 700. The exemplary apparatus 1200 in FIG. 12 comprises a modified scanning particle microscope 1210 in the form of a scanning electron microscope (SEM) 1210.

The apparatus 1200 comprises a particle beam source 1205 in the form of an electron beam source 1205, which generates an electron beam 1215 as a massive particle beam 1215. An electron beam 1215 has the advantage—compared with an ion beam—that the electrons that impinge on the sample 1225 or the photolithographic mask 700 substantially cannot damage the sample 1225 or the photomask 700. However, it is also possible to use an ion beam, an atom beam or a molecule beam (not illustrated in FIG. 12) in the apparatus 1200 for the purposes of processing the sample 1225.

The scanning particle microscope 1210 is composed of an electron beam source 1205 and a column 1220, in which is arranged the beam optical unit 1213 for instance in the form of an electron optical unit of the SEM 1210. In the SEM 1210 in FIG. 12, the electron beam source 1205 generates an electron beam 1215, which is directed as a focused electron beam 1215 onto the sample 1225, which can comprise the photolithographic mask 700, at the location 1222 by the imaging elements arranged in the column 1220, said imaging elements not being illustrated in FIG. 12. The beam optical unit 1213 thus forms the imaging system 1213 of the electron beam source 1205 of the SEM 1200.

Further, the imaging elements of the column 1220 of the SEM 1210 can scan the electron beam 1215 over the sample 1225. The sample 1225 can be examined using the electron beam 1215 of the SEM 1210. As a rule, the electron beam 1215 strikes the sample 1225 at right angles (not shown in FIG. 12). Instead, the SEM 1210 of the apparatus 1200 comprises a deflection system 1203. The latter can deflect the electron beam 1215 from the perpendicular, and so the electron beam 1215 is incident on the sample 1225 at an angle of less than 90°. As a result, the sample 1225 can be analyzed with a greater level of detail. This can at least partly overcome the limited spatial resolution of a massive particle beam 1215 in the beam direction.

The backscattered electrons and secondary electrons generated in the interaction region 1010, 1050, 1110 of the sample 1225 by the electron beam 1215 are registered by the detector 1217. The detector 1217 arranged in the electron column 1220 is referred to as an "in lens detector." The detector 1217 can be installed in the column 1220 in various embodiments. The detector 1217 converts the secondary electrons generated by the electron beam 1215 at the measurement point 1222 and/or the electrons backscattered from the sample 1225 into an electrical measurement signal and transmits the latter to an evaluation unit 1285 of a computer system 1280 of the apparatus 1200. The detector 1217 can contain a filter or a filter system in order to discriminate the electrons in terms of energy and/or solid angle (not reproduced in FIG. 12). The detector 1217 is controlled by a setting unit 1290 of the apparatus 1200.

The exemplary apparatus 1200 can include a second detector 1219. The second detector 1219 can be designed to detect electromagnetic radiation, in particular in the X-ray range. As a result, the detector 1219 makes it possible to analyze a material composition of the radiation generated by the sample 1225 during the examination thereof. The detector 1219 is likewise controlled by the setting unit 1290.

Further, the apparatus 1200 can comprise a third detector (not illustrated in FIG. 12). The third detector is often embodied in the form of an Everhart-Thornley detector and typically arranged outside the column 1220. As a rule, it is used to detect secondary electrons.

The apparatus 1200 can comprise an ion source that provides ions with low kinetic energy in the region of the sample 1225 (not illustrated in FIG. 12). The ions with low kinetic energy can compensate for charging of the sample 1225. Furthermore, the apparatus 1200 can comprise a mesh at the output of the column 1220 of the modified SEM 1210 (likewise not shown in FIG. 12). Electrostatic charging of a sample 1225 can likewise be compensated for by applying a voltage to the mesh. It is furthermore possible to earth the mesh.

The sample 1225 is arranged on a sample stage 1230 or a sample holder 1230 for examination purposes. A sample stage 1230 is also known as a "stage" in the art. As symbolized by the arrows in FIG. 12, the sample stage 1230 can be moved in three spatial directions relative to the column 1215 of the SEM 1210, for example by way of micro-manipulators that are not illustrated in FIG. 12.

Besides the translational movement, the sample stage 1230 can be rotated at least about an axis oriented parallel to the beam direction of the particle beam source 1205. It is furthermore possible for the sample stage 1230 to be embodied such that it is rotatable about one or two further axes, this axis or these axes being arranged in the plane of the sample stage 1230. The two or three axes of rotation preferably form a rectangular coordinate system. As can be gathered from FIG. 12, the rotation of the sample stage 1230 about an axis of rotation that is arranged in the plane of the sample stage 1230 is often possible only to a limited extent on account of the small distance between the end of the column and the sample 1235.

The sample 1225 to be examined can be any microstructured component or component part requiring an analysis and, possibly, subsequent processing, for example the repair of a local defect 750 and/or the setting of a side wall angle 670 of a pattern element 120 of a photolithographic mask 700. Thus, the sample 1225 can comprise a transmissive or reflective photomask 700 and/or a template for nanoimprint technology, for example. The transmissive and the reflective photomask 150, 700 can comprise all types of photomasks, for instance binary masks, phase-shifting masks, OMOG masks, or masks for a dual or multiple exposure.

Further, the apparatus 1200 in FIG. 12 can comprise one or more scanning probe microscopes, for example in the form of an atomic force microscope (AFM) (not shown in FIG. 12), which can be used to analyze and/or process the sample 1225.

The scanning electron microscope 1210 illustrated by way of example in FIG. 12 is operated in a vacuum chamber 1270. In order to generate and maintain a reduced pressure required in the vacuum chamber 1270, the SEM 1210 in FIG. 12 has a pump system 1272.

The apparatus 1200 includes a computer system 1280. The computer system 1280 comprises a scanning unit 1282, which scans the electron beam 1215 over the sample 1225. Further, the computer system 1280 comprises a setting unit 1290 for setting the various parameters of the modified scanning particle microscope 1210 of the apparatus 1200 and for altering one or more of these parameters while the sample 1225 is examined using the electron beam 1215. Furthermore, the setting unit 1290 can control the deflection system 1203 and rotation of the sample stage 1230.

Moreover, the computer system 1280 comprises an evaluation unit 1285, which analyzes the measurement signals from the detectors 1217 and 1219 and generates an image of the sample 1225 therefrom, said image being displayed on the display 1295 of the computer system 1280. In particular, the evaluation unit 1285 is designed to determine the relative position and a contour of a defect of missing material and/or a defect of excess material 750 of a sample 1225, for instance of the photolithographic mask 700, from the measurement data of the detector 1217. The evaluation unit 1285 can additionally contain one or more algorithms which make it possible to determine a repair shape corresponding to the analyzed defect 750 of the mask 700. The evaluation unit 1285 of the computer system 1280 can additionally contain one or more algorithms that can ascertain the parameters of the deflection system 1203. Examples for deflection systems 1203 for the electron beam 1215 are explained below on the basis of FIGS. 13 and 14. The algorithms of the evaluation unit 1285 can be implemented using hardware, software or a combination thereof. In particular, the algorithm(s) can be realized in the form of an ASIC (Application Specific Integrated Circuit) and/or an FPGA (Field Programmable Gate Array).

The computer system 1280 and/or the evaluation unit 1285 can include a memory (not illustrated in FIG. 12), preferably a non-volatile memory, which stores one or more models of repair shapes for various mask types. The evaluation unit 1285 can be designed to calculate, on the basis of a repair model, a repair shape for the defect(s) 750 of the photolithographic mask 700 from the measurement data of the detector 1217. Furthermore, the computer system 1280 can comprise an interface 1287 for exchanging data with the Internet, an intranet and/or some other apparatus, for example an apparatus for setting a side wall angle. The interface 1287 can comprise a wireless or a wired interface.

As indicated in FIG. 12, the evaluation unit 1285 and/or the setting unit 1290 can be integrated into the computer system 1280. However, it is also possible to embody the evaluation unit 1285 and/or the setting unit 1290 as independent unit(s) within or outside the apparatus 1200. In particular, the evaluation unit 1285 and/or the setting unit 1290 can be designed to carry out some of their tasks by use of a dedicated hardware implementation.

The computer system 1280 can be integrated into the apparatus 1200 or embodied as an independent device (not shown in FIG. 12). The computer system 1280 can be embodied using hardware, software, firmware, or a combination.

Diagram 1300 of FIG. 13 shows a magnified detail of the apparatus 1200 in the region of the point of incidence 1322 of the electron beam 1215 on the photolithographic mask 700 from FIG. 7. In the example illustrated in FIG. 13, the substrate 110 of the photolithographic mask 700 is arranged on the sample stage 1340 by means of a three-point bearing. The photomask 700 is held in its position by the action of gravity. The section of the diagram 1300 shows two of the three spheres 1320 of the three-point bearing.

A deflection system 1350 is installed in the apparatus 1200, between the output 1390 of the column 1220 of the SEM 1210 and the photomask 700. The deflection system 1350 comprises a magnetic deflection system 1330, which may be embodied in the form of a coil pair or one or more permanent magnets (not shown in FIG. 13), for example. In the example depicted in FIG. 13, the magnetic deflection system 1330 generates a magnetic field 1310, the field lines of which are perpendicular to the plane of the paper and directed into the plane of the paper. The electrons of the electron beam 1215 are deflected by the magnetic field 1310 generated by the magnetic deflection system 1330 when leaving the column 1220 and said electrons reach the photolithographic mask 700 at the point of incidence 1322 along a curved path 1315. By way of example, the electrons of the electron beam 1215 reach the defect of excess material 750. The electron beam 1215 deflected by the magnetic field 1310 of the magnetic deflection system 1330 strikes the mask 700 at an angle $\varphi_1$ that is smaller than the angle of incidence of a non-deflected electron beam $\varphi=90°$. The path 1315 of the electrons, which has been lengthened by the magnetic deflection system 1330, is taken into account when focusing the electron beam 1215.

The magnetic deflection system 1330 can generate a homogeneous or inhomogeneous magnetic field 1310. The strength of the magnetic field 1310 can be set by the setting unit 1290 of the computer system 1280, for example by way of the strength of the current flow through the coil pair which generates the magnetic field 1310.

In the example reproduced in FIG. 13, the magnetic deflection system 1330 generates a homogeneous magnetic field 1310, the field lines of which pass in perpendicular fashion through the plane of the paper. However, the magnetic deflection system 1330 could also generate a second magnetic field, the field lines of which extend parallel to the plane of the paper, for example. With the aid of two magnetic fields that are substantially perpendicular to one another, the magnetic deflection system 1330 can set not only the polar angle of the electron beam 1215 but also the azimuth angle thereof by virtue of modifying the field strength of the two magnetic fields. This allows the electron beam 1215 to reach different sides of a pattern element 120 of a photolithographic mask 700 at the angle of incidence $\varphi_1$. By way of example, the magnetic deflection system 1330 can set the magnetic field strength by altering the coil current and hence dynamically adjust the angle of incidence $\varphi_1$ to the currently examined defect during the analysis of the sample 1225 or of the photolithographic mask 700.

In FIG. 13, the magnetic deflection system 1330 is installed into the apparatus 1200 as a unit 1350 that is separate from, or independent of, the column 1220 of the SEM 1210. However, the magnetic deflection system 1330 could also be integrated into the SEM 1210 at the output of the column 1220 (not illustrated in FIG. 13).

Diagram 1400 of FIG. 14 presents a second exemplary embodiment of a deflection system 1203, 1350. In the example reproduced in FIG. 14, the deflection system 1203, 1350 comprises an electrical deflection system 1430. In FIG. 14, the electrical deflection system 1430 is realized by two additional deflection plate pairs 1410 and 1420, which are installed upstream of the electron-optical objective lens 1450 of the SEM 1210 in the column 1420 of the latter. The first deflection plate pair 1410 deflects the electron beam 1215 from the axis 1460 or the electron-optical axis 1460 of the SEM 1210. The second deflection plate pair 1420 is designed and arranged in such a way that the deflected electron beam 1415 substantially passes through the center of the electron-optical objective lens 1450. This beam guidance prevents the deflected electron beam 1415 from suffering significant imaging aberrations on account of the electron-optical objective lens 1450.

What can be gathered from FIG. 14 is that the electron beam 1415 deflected by the electrical deflection system 1430 is incident on the sample 1225 at an angle $\varphi_2$ that is significantly reduced in relation to the angle of incidence of a non-deflected electron beam. Moreover, the deflected electron beam 1415 strikes a site 1422 on the surface 115 of the sample 1225 that differs from the point of incidence of a non-deflected electron beam. The angle of incidence $\varphi_2$ on the surface 115 of the sample 1225 can be set by varying the voltages that are applied to the deflection plate pairs 1410 and 1420 of the electrical deflection system 1430. Further, by changing the voltages applied to the deflection plate pairs 1410 and 1420, it is possible to alter the angle of incidence $\varphi_2$ in adjustable manner during the scanning or examination of the sample 1225. The setting unit 1290 can set and control the electrical deflection system 1430. The evaluation unit 1285 can ascertain the settings of the electrical deflection system 1430 on the basis of the measurement data ascertained for a defect.

In the example depicted in FIG. 14, the electrical deflection system 1430 is designed to deflect the electron beam 1215 in a direction with respect to the electron-optical axis 1460. Naturally, the electrical deflection system 1430 can also be designed in such a way that the latter can deflect the electron beam 1215, which passes through the deflection system 1430, in two different directions with respect to the electron-optical axis 1460 of the SEM 1210.

Further, a magnetic deflection system 1330 and an electrical deflection system 1430 could be combined in one deflection system 1203, 1350. The deflection systems 1330 and 1430 can be used not only to deflect massive particles in the form of electron beams 910. Rather, these deflection systems 1340 and 1440 can also be used to deflect ion beams.

Figure 15:
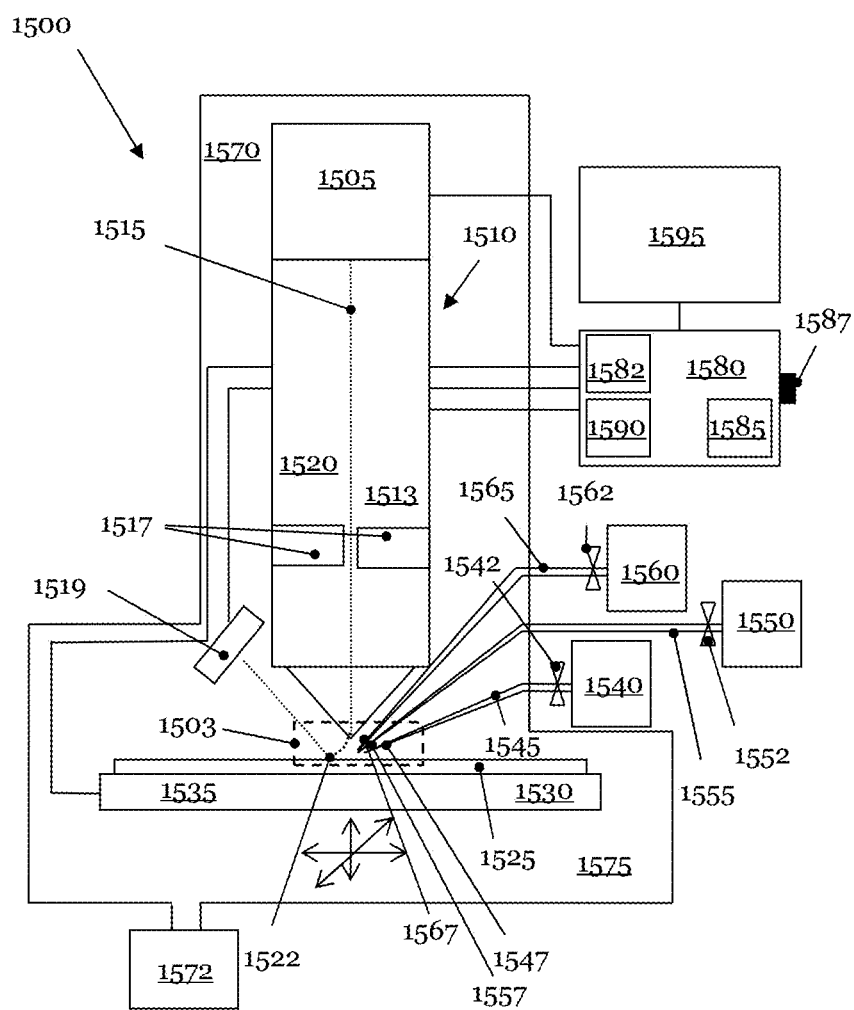
FIG. 15 depicts a schematic section through some components of an apparatus for setting a side wall angle of a pattern element of a photolithographic mask.

FIG. 15 shows a schematic section through some important components of an apparatus 1500 that is able to prevent the occurrence of at least one of the above-described difficulties when locally processing a sample 1525, for example of a photolithographic mask 700. The apparatus 1500 can be used for instance to correct a defect 750 of a photomask 700 and it is possible to set a side wall angle 170, 670 of a pattern element 120. The exemplary apparatus 1500 in FIG. 15 comprises a modified scanning particle microscope 1210, once again in the form of a scanning electron microscope (SEM) 1510. To avoid unnecessary lengths, parts of the apparatus 1500 which are the same as or very similar to the apparatus 1200 of FIG. 12 are not described again or are only described very briefly. Instead, reference is made to the discussion of FIG. 12.

The sample 1525 is arranged on a sample stage (stage) 1530. The imaging elements of the column 1520 of the SEM 1510 can focus the electron beam 1515 and scan the latter over the sample 1525. The electron beam 1515 of the SEM 1510 can be used to induce a particle beam-induced deposition process (e.g., EBID, electron beam induced deposition) and/or a particle beam-induced etching process (e.g., EBIE, electron beam induced etching). Moreover, the electron beam 1515 of the SEM 1510 can also be used to analyze the sample 1525 or a defect of the sample 1525, for example the defect of excess material 750 on the photolithographic mask 700.

The backscattered electrons and secondary electrons generated in the interaction region 1010, 1050, 1110 of the sample 1525 by the electron beam 1515 are registered by the detector 1517. The detector 1517 arranged in the electron column 1520 is referred to as an "in lens detector." The detector 1517 can be installed in the column 1520 in various embodiments. The detector 1517 converts the secondary electrons generated by the electron beam 1515 at the measurement point 1522 and/or the electrons backscattered from the sample 1525 into an electrical measurement signal and transmits the latter to an evaluation unit 1585 of a computer system 1580 of the apparatus 1500. The detector 1517 can contain a filter or a filter system in order to discriminate the electrons in terms of energy and/or solid angle (not reproduced in FIG. 15). The detector 1517 is controlled by a setting unit 1590 of the apparatus 1500.

The second detector 1519 of the apparatus 1500 is designed to detect electromagnetic radiation, particularly in the x-ray range. Hence, the detector 1519 facilitates the analysis of the radiation generated during a process of processing the sample 1525. The detector 1519 is typically likewise controlled by the setting unit 1590.

As already explained above, the electron beam 1515 can also be used to induce an electron-beam-induced deposition process and an EBIE process in addition to analyzing the sample 1525. Further, the electron beam 1515 of the SEM 1510 of the apparatus 1500 can also be used to carry out an EBID process. The exemplary apparatus 1500 of FIG. 15 has three different supply containers 1540, 1550 and 1560, for storing various precursor gases, for the purposes of carrying out these processes.

The first supply container 1540 stores a precursor gas, for example a metal carbonyl, for instance chromium hexacarbonyl ($Cr(CO)_6$), or a main group metal alkoxide, such as TEOS, for instance. With the aid of the precursor gas stored in the first supply container 1540, material missing from the photolithographic mask 700 can be deposited thereon within the scope of a local chemical deposition reaction, for example. Missing material of a mask 700 may comprise missing absorber material, for example chromium, missing substrate material 110, for instance quartz, missing material of an OMOG mask, for instance molybdenum silicide, or missing material of a multilayer structure of a reflecting photomask, for instance molybdenum and/or silicon.

As described above in the context of FIG. 10, the electron beam 1515 of the SEM 1510 acts as an energy supplier for splitting the precursor gas, which is stored in the first supply container 1540, at the site where material should be deposited on the sample 1525. This means that the combined provision of an electron beam 1515 and a precursor gas leads to an EBID process being carried out for local deposition of missing material, for example material missing from the photomask 700. The modified SEM 1510 of the apparatus 1500 forms a deposition apparatus in combination with the first supply container 1540.

An electron beam 1515 can be focused onto a spot diameter ranging from the nanometer range into the sub-nanometer range. As a result, an EBID process allows the local deposition of missing material with a spatial resolution in the low single-digit nanometer range. However, a small focus diameter of the electron beam 1515 correlates with a large aperture angle β—as discussed in the context of FIG. 9.

In the apparatus 1500 depicted in FIG. 15, the second supply container 1550 stores an etching gas, which allows a local electron beam-induced etching (EBIE) process to be carried out. Excess material can be removed from the sample 1525, for instance the excess material 750 or the defect of excess material 750 from the surface 115 of the substrate 110 of the photolithographic mask 700, with the aid of an electron beam-induced etching process. By way of example, an etching gas may comprise xenon difluoride ($XeF_2$), a halogen or nitrosyl chloride (NOCl). Consequently, the modified SEM 1510 forms a local etching apparatus in combination with the second supply container 1550.

An additive or additional gas can be stored in the third supply container 1560, said additive gas, where necessary, being able to be added to the etching gas kept available in the second supply container 1550 or to the precursor gas stored in the first supply container 1540. Alternatively, the third supply container 1560 can store a second precursor gas or a second etching gas.

In the scanning electron microscope 1510 illustrated in FIG. 15, each of the supply containers 1540, 1550 and 1560 has its own control valve 1542, 1552 and 1562 in order to monitor or control the amount of the corresponding gas that is provided per unit time, i.e., the gas volumetric flow at the site 1522 of the incidence of the electron beam 1515 on the sample 1525. The control valves 1542, 1552 and 1562 are controlled and monitored by the setting unit 1590. Using this, it is possible to set the partial pressure conditions of the gas or gases provided at the processing location 1522 for carrying out an EBID and/or EBIE process in a wide range.

Furthermore, in the exemplary SEM 1510 in FIG. 15, each supply container 1540, 1550 and 1560 has its own gas feedline system 1545, 1555 and 1565, which ends with a nozzle 1547, 1557 and 1567 in the vicinity of the point of incidence 1522 of the electron beam 1515 on the sample 1525.

The supply containers 1540, 1550 and 1560 can have their own temperature setting element and/or control element, which allows both cooling and heating of the corresponding supply containers 1540, 1550 and 1560. This makes it possible to store and in particular provide the precursor gas and/or the etching gas(es) 640 at the respectively optimum temperature (not shown in FIG. 15). The setting unit 1590 can control the temperature setting elements and the temperature control elements of the supply containers 1540, 1550, 1560. During the EBID and the EBIE processing processes, the temperature setting elements of the supply containers 1540, 1550 and 1560 can further be used to set the vapor pressure of the precursor gases stored therein by way of the selection of an appropriate temperature.

The apparatus 1500 may comprise more than one supply container 1540 in order to store two or more precursor gases. Further, the apparatus 1500 may comprise more than one supply container 1550 in order to store two or more etching gases 640 (not shown in FIG. 15).

The scanning electron microscope 1510 illustrated in FIG. 15 is operated in a vacuum chamber 1570. As a rule, implementing the EBID and EBIE processes necessitates a negative pressure in the vacuum chamber 1570 relative to the ambient pressure. For this purpose, the SEM 1510 in FIG. 15 comprises a pump system 1572 for generating and for maintaining a negative pressure required in the vacuum chamber 1570. With closed control valves 1542, 1552 and 1562, a residual gas pressure of $<10^{-4}$ Pa is achieved in the vacuum chamber 1570. The pump system 1572 can comprise separate pump systems for the upper part of the vacuum chamber 1570 for providing the electron beam 1515 of the SEM 1510 and for the lower part 1575 or the reaction chamber 1575 (not shown in FIG. 15).

The apparatus 1500 includes a computer system 1580. The computer system 1580 comprises a scanning unit 1582, which scans the electron beam 1515 over the sample 1525. Further, the computer system 1580 comprises a setting unit 1590 for setting and controlling the various parameters of the modified scanning particle microscope 1510 of the apparatus 1500. Furthermore, the setting unit 1590 can control the rotation of the sample stage 1530. In particular, the adjustment unit 1590 can alter one or more parameters of the electron beam 1515 and/or one or more process parameters during a processing process, for instance during a repair of a defect 750 and/or during setting of a side wall angle 170, 670.

Furthermore, the computer system 1580 comprises an evaluation unit 1585, which analyzes the measurement signals from the detectors 1517 and 1519 and generates an image therefrom, said image being displayed on the display 1595 of the computer system 1580. In particular, the evaluation unit 1585 is designed to determine the position and a 3D contour of a defect of missing material and/or a defect of excess material 750 of a sample 1525, for instance of a photolithographic mask 700, from the measurement data of the detector 1517. The evaluation unit 1585 can receive the measurement data for carrying out this task via the interface 1587 of the apparatus 1500. On the basis of these data the evaluation unit 1585 is able to ascertain the parameters of a repair shape, with the aid of which the identified defect 750 can be repaired.

However, it is also possible for the apparatus 1500 to ascertain the measurement data itself with the aid of the electron beam 1515 and the detector or detectors 1517 and 1519. In an alternative embodiment, the evaluation unit 1585 receives the position and the 3D contour of a defect 750 to be processed from the apparatus 1200 for examining the defect 750. However, it is also possible for the evaluation unit 1585 of the apparatus 1500 to obtain the parameter of the repair shape from the apparatus 1200 via the interfaces 1287 and 1587 thereof.

Moreover, the evaluation unit 1585 can contain one or more algorithms which make it possible to determine a repair shape corresponding to the analyzed defect 750 of the mask 700. Moreover, the evaluation unit 1585 of the computer system 1580 may contain one or more algorithms. The algorithm or algorithms can determine a change in the angle of incidence of the electron beam 1515 on the sample 1525, for instance the defect 750 of the pattern element 120 of the photomask 700, from the kinetic energy of the electrons of the particle beam 1515, a material composition to be etched or deposited and/or the 3D contour of the defect 750.

Moreover, algorithms of the evaluation unit 1585 can ascertain the parameters of a deflection system 1330, 1430, 1503. To this end, they ascertain a change in the angle of incidence p of the electron beam 1515 on the sample 1525 such that the EBIE or EBID process initiated by the electron beam 1515 has an edge slope 670 of a side wall 160 of a pattern element 120 within a specified range. Examples of deflection systems for the electron beam 1515 are explained on the basis of FIGS. 13 and 14. The algorithms of the evaluation unit 1585 can be implemented using hardware, software, or a combination thereof.

The evaluation unit 1585 can further be designed to ascertain, from the measurement data of the detector 1519, an area and a positioning of a temporary, locally restricted protective layer relative to a site to be processed. The application of a temporary, locally restricted protective layer at least partly around a local processing site can largely prevent regions of the sample 1525 that are not involved with a local processing process that is being carried out, for instance parts of the substrate 110 of the mask 700, from being impaired or damaged. The setting unit 1590 of the computer system 1580 can control both the deposition of a temporary, locally restricted protective layer, for instance by use of an EBID process, and also the removal thereof, for example by carrying out an EBIE process. In an alternative embodiment, the temporary, locally restricted protective layer can be removed from the sample 1525 during a cleaning process of the sample 1525, for instance a wet-chemical cleaning process.

The computer system 1580 and/or the evaluation unit 1585 can include a memory (not illustrated in FIG. 15), preferably a non-volatile memory, which stores one or more models of repair shapes for various mask types. The evaluation unit 1585 can be designed to calculate, on the basis of a repair model, a repair shape for the defects 750 of the photolithographic mask 700 from the measurement data of the detector 1517. However, it is also possible for the evaluation unit 1585 to receive measurement data from the apparatus 1200 via the interfaces 1287 and 1587 and determine the parameters of a repair shape on the basis thereof.

As already explained above in the context of FIG. 12, the evaluation unit 1585 as reproduced in FIG. 15 can be integrated into the computer system 1580. However, it is also possible to embody the evaluation unit 1585 and/or the setting unit 1590 as independent units within or outside the apparatus 1500. In particular, the evaluation unit 1585 and/or the setting unit 1590 can be designed to carry out some of their tasks by use of a dedicated hardware implementation.

Finally, the computer system 1580 can be integrated into the apparatus 1500 or embodied as an independent device (not reproduced in FIG. 15). The computer system 1580 may be configured in hardware, software, firmware or a combination thereof.

Figure 16:
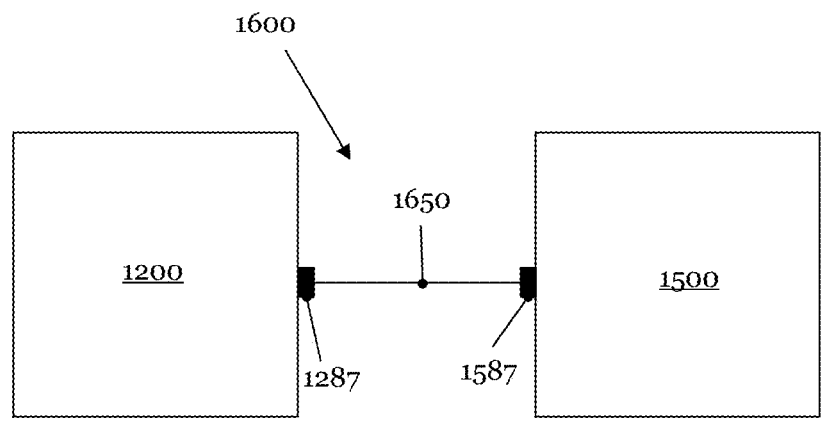
FIG. 16 reproduces a schematic section through a combination of the apparatuses of FIGS. 12 and 15.

FIG. 16 shows a combination 1600 of the apparatuses 1200 and 1500, which can exchange data via the interfaces 1287 and 1587 and the link 1650. Thus, the apparatus 1200 for examining a defect 750 of a photolithographic mask 700 can transfer measurement data from the defect 750 to the apparatus 1500 for setting a side wall angle 170, 670. However, the apparatus 1200 can also transmit an ascertained 3D contour of the defect 750 to the apparatus 1500. Further, it is possible that the apparatus 1200 transfers the parameters of a repair shape of the identified defect 750 to the apparatus 1500 via the link 1650. Moreover, it is possible for the apparatus 1200 to be integrated into the apparatus 1500 in part or in full.

Figure 17:
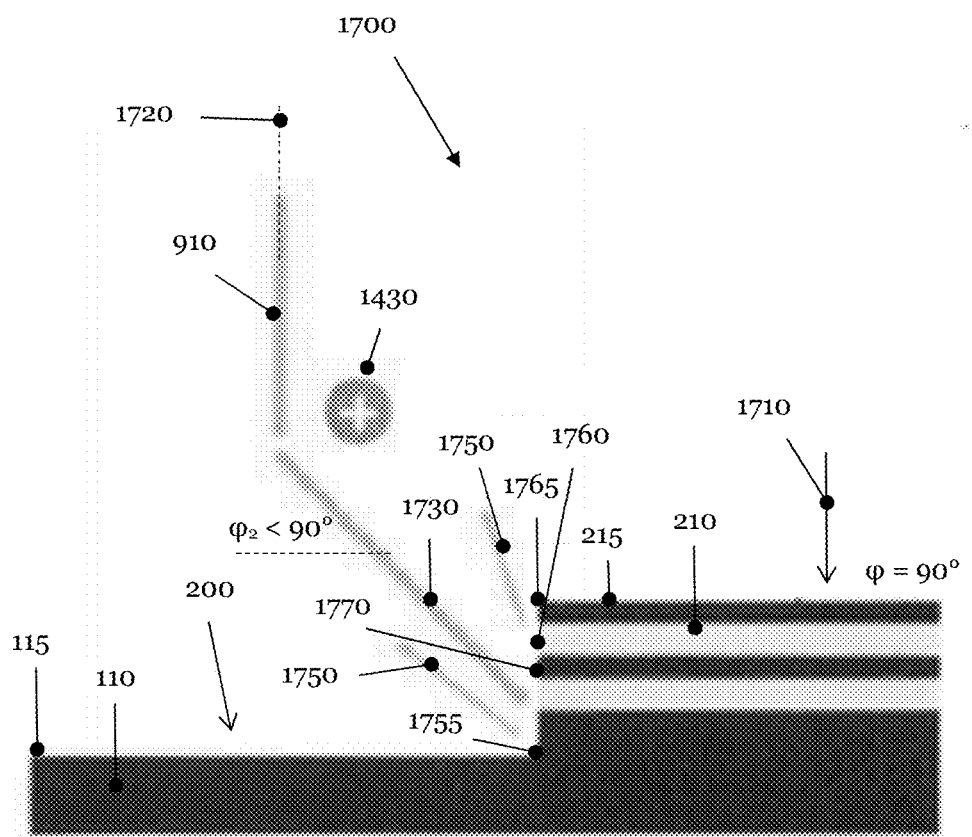
FIG. 17 shows an examination of an edge of a multilayer structure of an EUV mask using a massive particle beam that has been deflected from the optical axis.

Diagram 1700 of FIG. 17 schematically presents the examination of an edge 1760 of a mask detail of an EUV mask 200 using the apparatus 1200. In a first step, which is merely elucidated by the arrow 1710 in FIG. 17, the electron beam 910 scans the surface 115 of the substrate 110, the surface 215 of the multilayer structure 210 and the edge 1760. In the process, the electron beam 910 strikes the surfaces 115 and 215 of the substrate 110 and of the multilayer structure 210 in perpendicular fashion.

In a second step, the setting unit 1290 of the apparatus 1200 activates the electrical deflection system 1430 and applies a voltage to the deflection plate pair or pairs 1410, 1420, which has been ascertained by the evaluation unit 1285 of the apparatus 1200 from measurement data of the first scan for precisely scanning the edge 1760. The electrical deflection system 1430 deflects the electron beam 910 from the beam direction 1720 and the deflected electron beam 1730 strikes the edge 1760 of the EUV mask 200 at an angle of incidence $\varphi_2$ which is significantly smaller than 90°. The edge 1760 and the radii of curvature 1755 and 1765 are scanned anew with the deflected electron beam 1730. The secondary electrons generated by the electron beam 1730 while scanning the edge 1760 are reproduced in FIG. 17 by reference sign 1750. The secondary electrons 1750 are used to generate an image of the edge 1760 and the surroundings thereof by way of the evaluation unit 1285.

The evaluation unit 1285 of the apparatus 1200 generates a realistic image of the mask detail of the EUV mask 200 from the measurement data of the first scan (with a non-deflected electron beam 910) and the second scan (with a deflected electron beam 1730). From this image or from the measurement data of the two scans, it is possible to ascertain both the edge slope 1770 of the edge 1760 and the radii of curvature 1755 and 1765 with great precision. If it emerges during the evaluation of the measurement data that the chosen deflection angle $\varphi_2$ is not optimally suited to scanning the edge 1760, it is possible to choose a different (larger or smaller) deflection angle $\varphi_2$ and the edge 1760 can be scanned anew together with the radii of curvature. Further, it is possible that the evaluation unit 1285 ascertains a change in the deflection angle $\varphi_2$ while scanning the edge 1760 and the adjustment unit 1290 changes the deflection angle of the electron beam 1730.

If, like in the context of FIG. 17, a defect 750 is scanned instead of the edge 1760, the evaluation unit 1285 of the apparatus 1200 can ascertain a 3D contour of the defect 750 from the measurement data records of two or more scans of the defect 750, with at least one scan being implemented with a deflected massive particle beam 1730.

In an alternative exemplary embodiment, a defect 750 can be examined using the apparatus 1500 for setting a side wall angle 170, 670.

Figure 18:
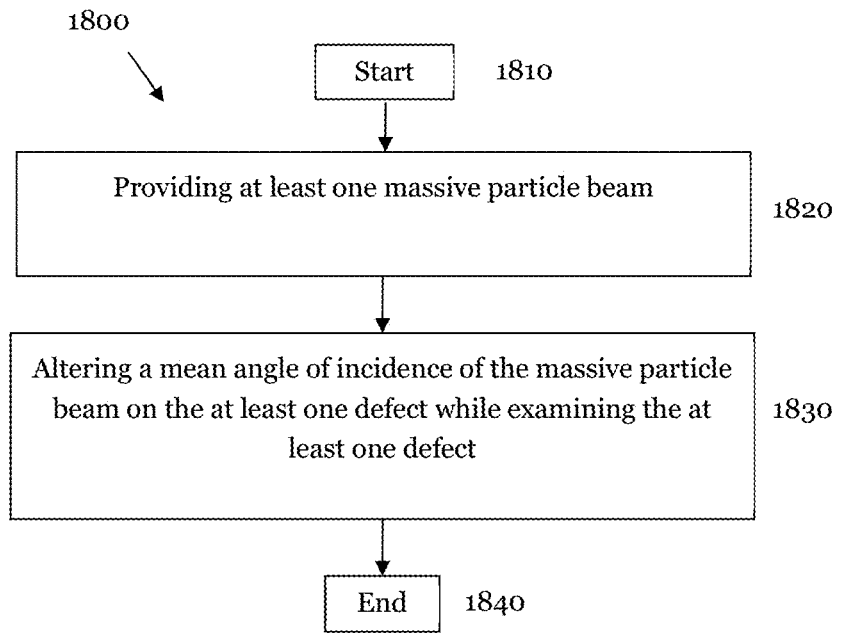
FIG. 18 presents a flowchart of a method for examining a defect of a photolithographic mask.

The flowchart 1800 of FIG. 18 presents steps of the method for examining at least one defect 750 of a photolithographic mask 700 using at least one massive particle beam 910. The method begins in step 1810. At least one massive particle beam 910 is provided in the next step 1820. Such a massive particle beam 910 preferably comprises an electron beam 910. Then, in step 1830, a mean angle of incidence $\varphi_1$, $\varphi_2$ of the massive particle beam 910 on at least one defect 750 is altered while the at least one defect 750 is examined. The mean angle of incidence $\varphi_1$, $\varphi_2$ can be altered with the aid of a deflection system 1203, 1330, 1430, 1503. The method ends in step 1840.

Figure 19:
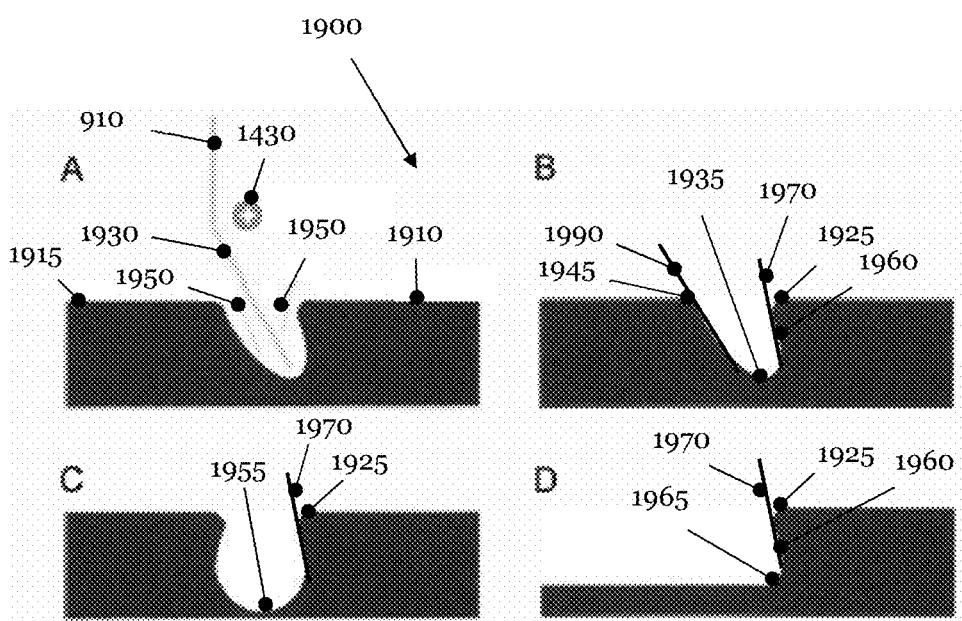
FIG. 19 schematically elucidates the etching of a cutout and an edge in a sample using a deflected massive particle beam by use of an EBIE process.

Diagram 1900 of FIG. 19 schematically shows the etching of a depression into a sample 1910 by carrying out an EBIE process with the aid of the apparatus 1500, wherein the electron beam 1930 is incident on the sample 1910 at an angle $\varphi_2 < 90°$. By way of example, the depression can be a line etched into the sample 1910 in a direction perpendicular to the plane of the drawing. By way of example, the sample 1910 can be the substrate 110, a multilayer structure 210 and/or a pattern element 220 of an EUV mask 200. Partial image A of FIG. 19 reproduces the implementation of an EBIE process with a deflected electron beam 1930. For simplification, the etching gas 640 has been suppressed in FIG. 19. The electron beam 910 generated by the particle beam source 1510 runs through the column 1520 of the SEM 1510 along the optical axis. The electrical deflection system 1430 deflects the electron beam 1930 from the optical axis of the column 1520 such that said electron beam strikes the surface 1915 of the sample 1910 at an angle $\varphi_2 < 90°$. The mean direction of the depression generated by the EBIE process is substantially parallel to the direction of the incident electron beam 1930.

Partial image B of FIG. 19 reproduces the depression generated. The two side wall angles 1970 and 1990 generated by the EBIE process differ from one another. However, both depend on the angle of incidence $\varphi_2$ of the electron beam 1930 on the sample 1910. The two radii of curvature 1925 and 1945 likewise have different numerical values. The depression generated is round 1935 at its lower end. To set the side wall angle 1970 and/or the radius of curvature 1925, the angle of incidence $\varphi_2$ of the electron beam 1930 can be altered while the depression is being etched.

Partial image C of FIG. 19 shows the depression of partial image B which results after rotating the sample through 180° about the optical axis of the column 1520 of the SEM 1510 or by deflecting the electron beam 910 in the opposite direction with respect to partial image A which causes a widening of the depression to form a symmetric depression. As is evident from partial images A to C of FIG. 19, it is possible with the aid of an EBIE process which uses an electron beam 1930 whose angle of incidence $\varphi_2$ on the sample surface 1915 is less than 90° to etch a structure into a sample 1910, the side wall angle 1970 of said structure being adjustable by way of the angle of incidence $\varphi_2$ on the sample surface 1915. Moreover, the angle of incidence $\varphi_2$ influences the radius of curvature 1925 of the transition of the etched structure to the sample surface 1915.

Partial image D of FIG. 19 reproduces the right edge of the depression of partial image B with the edge slope 1970 after the part of the sample 1910 to the left of the depression was etched away to a given depth with the aid of an EBIE process. For this etching process, the energy-supplying electron beam can be incident on the sample 1910 without deflection (i.e., as electron beam 910) or with deflection (i.e., as electron beam 1930). Should the edge slope 1970 not lie within a specified interval and/or the radii of curvature 1925 and 1965 not have the desired numerical values, the etched edge 1960 can be processed anew with the aid of an EBIE process, with the electron beam 1930 having a different angle of incidence $\varphi_2$. Self-evidently, it is naturally also possible to alter the angle of incidence $\varphi_2$ of the electron beam 1930 while etching the depression.

Figure 20:
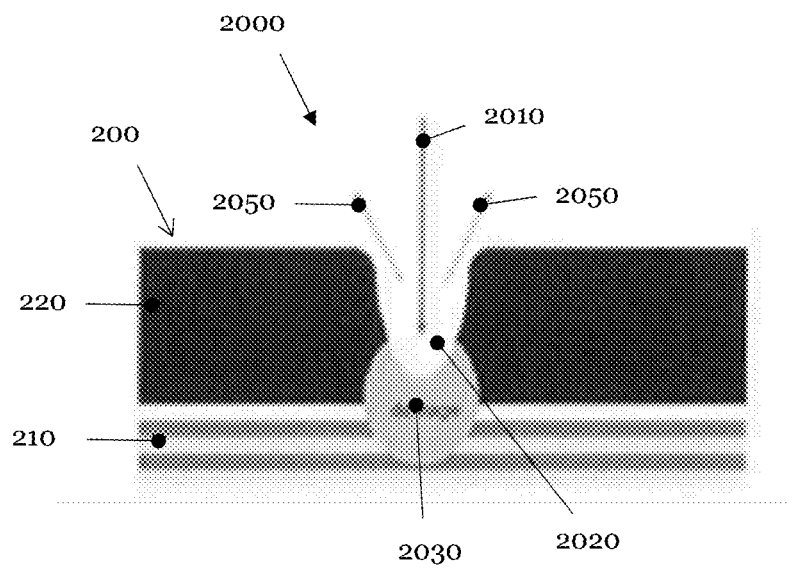
FIG. 20 schematically reproduces the implementation of an ion beam-induced etching process according to the prior art.

Diagram 2000 of FIG. 20 elucidates the etching of an opening 2020 in a pattern element 220 arranged on a multilayer structure 210 of the EUV mask 200. Unlike previously, an ion beam 2010 which is incident on the pattern element 220 of the EUV mask 200 in perpendicular fashion is used to generate the opening 2020. Etching with an ion beam 2010 has at least two significant advantages in comparison with electron beam-induced etching. Firstly, an ion beam can generate the opening 2020 by carrying out a sputtering process. During a sputtering procedure, the atoms of the lattice of the pattern element 220 are substantially ripped from their bonds by a transfer of momentum by the ions of the ion beam 2010. Therefore, an etching process carried out with an ion beam 2010 is significantly faster than an EBIE process. Secondly, the ion beam 2010 can frequently etch the opening 2020 without the provision of an etching gas 640.

However, these advantages are opposed by just as significant disadvantages. Firstly, the lattice of the pattern element 220 suffers significant damage in the region of interaction between the ions and the lattice atoms as a result of the transfer of momentum from the high-mass ions on the atoms of the pattern element 220. Secondly, a significant component of the ions is introduced into the damaged lattice of the pattern elements 220 or into the multilayer structure 210 lying therebelow, as a result of which the properties, for example the optical properties, are significantly altered in the interaction region. In FIG. 20, the interaction region or the damage region is elucidated by the grey scattering cone 2030. Generating the opening 2020 of the pattern element 220 results in damage to the upper—decisive—layers of the multilayer structure 220 in the etching process illustrated in FIG. 20.

Figure 21:
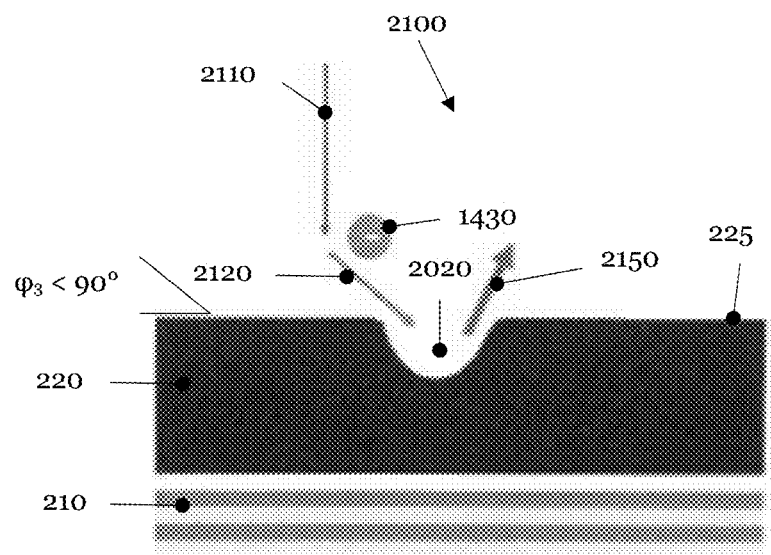
FIG. 21 schematically depicts the implementation of an ion beam-induced etching process, wherein the ion beam is incident on the sample at an angle of less than 90°.

Diagram 2100 of FIG. 21 shows how the disadvantages of an ion beam-induced etching process can be substantially avoided by way of a non-perpendicular incidence of an ion beam. The ion beam 2010 running along the optical axis of an FIB (focused ion beam) apparatus is deflected with the aid of a deflection system 1203, 1330, 1430, 1503 and, as a deflected ion beam 2120, strikes the surface 225 of the pattern element 220 at an angle $\varphi_3 < 90°$. The sputtering rate and hence the process speed reaches its maximum value in the case of a flat angle of incidence $\varphi_3 << 90°$ of the ion beam 2120. Moreover, a majority of the atoms 2150 sputtered by the ion beam 2120 leave the pattern element 220. This is an additional advantage of an etching process carried out with a deflected ion beam 2120. At the same time, less energy and fewer ions of the deflected ion beam 2120 are introduced into the pattern element 220. However, it is even more important that hardly any damage arises in the multilayer structure 210 below the opening 2030 as a result of the etching or sputtering process carried out with a deflected ion beam 2120. This means that the optical properties of the multilayer structure 210 are substantially not impaired by the ion beam-induced etching process.

Figure 23:
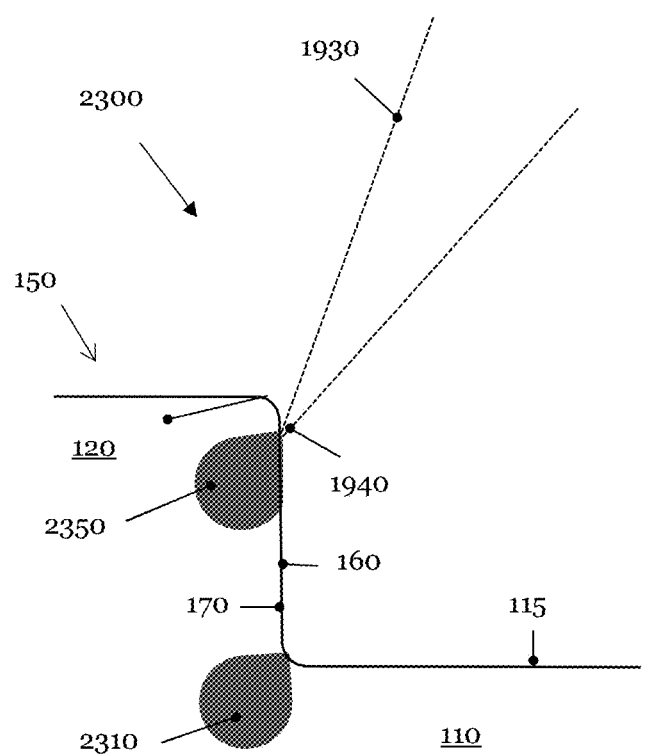
FIG. 23 schematically reproduces the implementation of an examination procedure or an etching process on the side wall of a pattern element using the electron beam of FIG. 22.

FIGS. 22 and 23 illustrate how the difficulties explained in FIGS. 9 and 10 arising during local examination and/or processing of a sample 1225, 1525, for example of the photomask 150, 700, can be largely removed by reducing the mean angle of incidence of the massive particle beam 1215, 1515, 1930 on the side wall 160 of the pattern element 120. The upper partial image 2205 of FIG. 22 elucidates the incidence of the electron beam 1215, 1515 1930, which has been deflected by the angle $\varphi_2$, on the photolithographic mask 150. Exemplary apparatuses for deflecting the electron beam 1215, 1515, 1930 are explained in the context of FIGS. 13 and 14.

The lower partial image 2255 of FIG. 22 presents the intensity distribution of the deflected electron beam 1215, 1515, 1930 in the focus 1940 thereof. As elucidated in FIG. 22, reducing the mean angle of incidence of the electron beam 1215, 1515, 1930 on the side wall 160 of the photolithographic mask 150, 700 allows the electron beam 1215, 1515, 1930 to be focused onto a small spot diameter 1980 at the focus without the large aperture angle β caused thereby being noticeably shadowed by the pattern element 120 of the photomask 150, 700.

FIG. 23 presents interaction regions 2310, 2350 of the electron beam 1215, 1515, 1930 when examining and/or when processing, for example when etching, the side wall 160 of the photolithographic mask 150, 700, wherein the mean angle of incidence $\varphi_2$ of the electron beam 1215, 1515, 1930 on the side wall 160 is less than 90°, as specified in partial image 2205. The problems of examining and/or processing the side wall 160 using a non-deflected electron beam have already been explained in the context of FIG. 10. Unlike in FIG. 10, the interaction region 2350 is hardly deformed any more when examining and/or processing the side wall 160 with the angle of incidence $\varphi_2$<90°. By way of example, this means that the side wall 160 can be scanned by the electron beam 1215, 1515, 1930 without the interaction regions 2310 and 2350 leading to the substrate 110 of the photomask 150 being damaged.

Further, the side wall 160 can be processed by the deflected electron beam 1215, 1515, 1930, for instance etched by use of an EBIE process, with the edge slope 170 in the exemplary process illustrated in FIG. 23 not being altered significantly. However, this is a consequence of the specifically chosen angle of incidence $\varphi_2$. Further, neither the angle of incidence $\varphi_2$ nor a process parameter was altered during the etching process. It is possible to set the edge slope 170 by altering the angle of incidence $\varphi_2$ and/or a process parameter, as explained in the context of FIG. 19. A further advantage of a deflected electron beam 1215, 1515, 1930 is that the surface 115 of the substrate 110 is not noticeably attacked while the local etching process is carried out.

Figure 24:
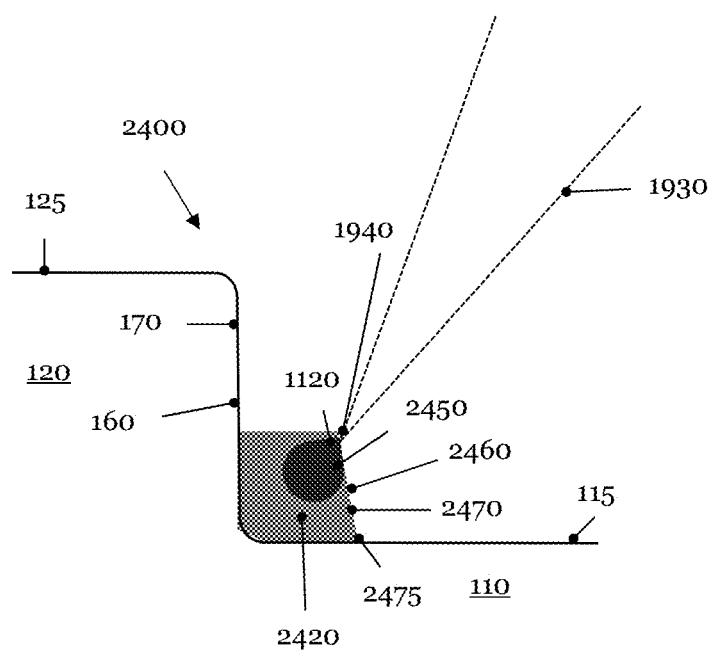
FIG. 24 schematically depicts the deposition of material on a pattern element using a deflected electron beam.

Diagram 2400 of FIG. 24 presents the correction of a defect of missing material by way of the deposition of material 2420 along the side wall 160 of the pattern element 120 on the substrate 110 of the photolithographic mask 150. In contrast to the implementation of the deposition process as explained in FIG. 11, the mean angle of incidence of the massive particle beam 1930 $\varphi_2$<90° on the surface 115, 125, 160 of the photomask 150 was reduced—similar to in FIGS. 22 and 23—before the process started. What can be gathered from FIG. 24 is that the deposit 2420 is deposited with a side wall 2460 or an edge slope 2470 that deviates slightly from the angle of 90° as predetermined by the design of the photomask 150. The edge slope 2470 of the side wall 2460 generated can be set by the choice of the angle of incidence $\varphi_2$ and, in particular, by a change during the deposition process. If necessary, one or more process parameters can additionally be altered during the deposition process. Moreover, the radius of curvature 2475 of the side wall 2460 generated is not significantly greater than that of a defect-free pattern element 120 of the photomask 150. Moreover, the deposition process explained within the scope of FIG. 24 deposits substantially no material 2420 on the surface 115 of the substrate 110 of the photolithographic mask 150.

Figure 25:
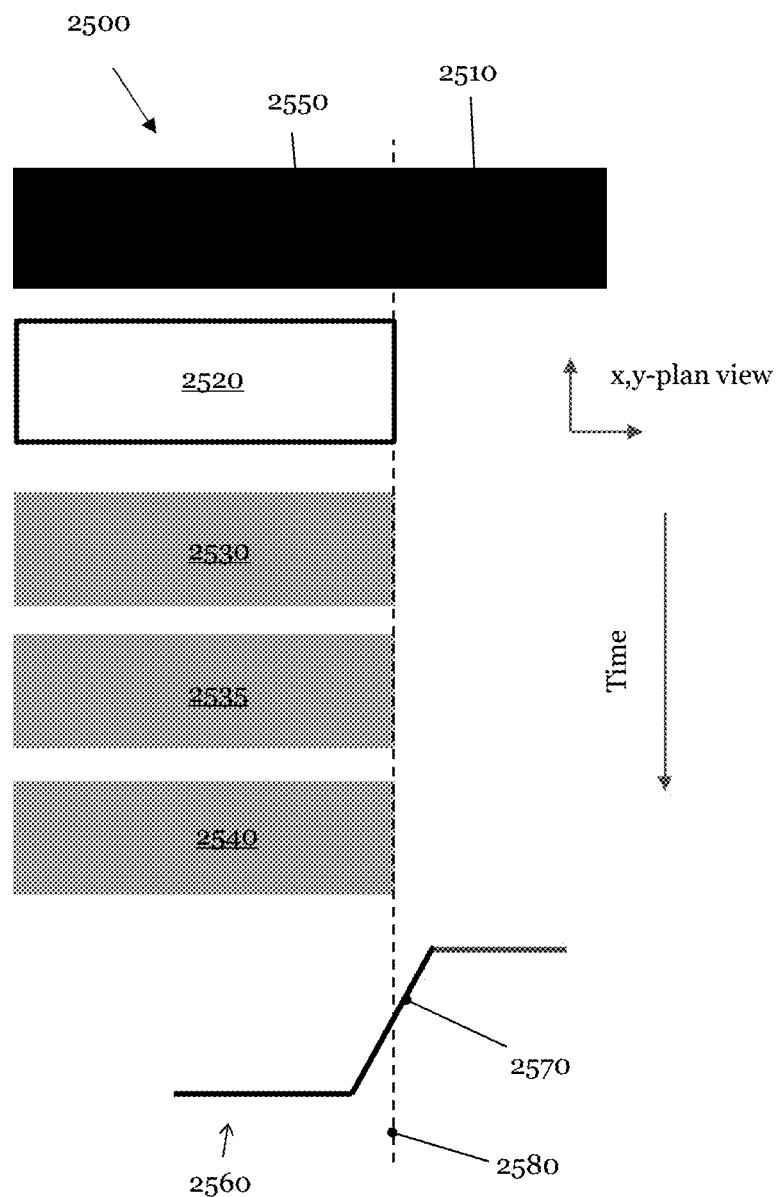
FIG. 25 schematically presents the etching of a defect by use of a repair shape according to the prior art.

Diagram 2500 of FIG. 25 shows the correction of a defect 2550 which adjoins a pattern element 2510 of a photomask, in accordance with a method from the prior art. By way of example, the pattern element 2510 can be arranged on a substrate 110 of a mask 150 or on a multilayer structure 220 of an EUV mask 200. The defect 2550 is repaired with the aid of an EBIE process. A plan view of a repair shape 2520 which is used to correct the defect 2550 is arranged below the defect 2550. The areas 2530, 2535 and 2540 with a grey background represent the areas exposed over the defect 2550 by the repair shape 2520 during the course of the etching process of the defect. This means that scanning the repair shape 2520 over the defect exposes the areas 2530, 2535 and 2540 of the defect 2550 with a grey background successively.

When exposing or scanning the defect 2550 as specified by the repair shape 2520, an etching gas 640, for example xenon difluoride ($XeF_2$) or, in general, a halogen-containing gas is provided above the defect 2550 (not shown in FIG. 25). The process parameters, for example the repetition time, i.e., the time interval until the electron beam 910 returns to the same point within the repair shape, the dwell time, i.e., the period of time that the electron beam 910 dwells at a scanned point, the spacing of the individual scanned points and the acceleration voltage of the electrons of the electron beam 910, are set before the EBIE process is carried out. The area 2530 specifies the first scan of the repair shape 2520 over the defect 2550. The area 2535 reproduces a scan of the repair shape over the defect 2550 approximately after half of the etching time for removing the defect 2550. By way of example, half of the defect 2550 (in particular half of its height) may be reached after a few thousand implementations of the repair shape 2520 over the defect 2550. The area 2540 describes the implementation of the repair shape 2520 at the end of the etching process. The time runs from top to bottom in the example of FIG. 25. As is evident from the exposed areas 2530, 2535 and 2540, the area exposed by the repair shape 2520 does not change during the etching process.

The curve 2560 specifies an etching profile in the x-direction and z-direction of the side wall of the pattern element 2510 that is newly formed by the etching process. The etching profile arising at the edge 2580 generates an edge slope 2570 or a side wall angle 2570 which is defined by the repair shape 2520 and the process parameters. The edge slope 2570 has an angle that is significantly smaller than an angle of 90° as specified by the design.

Diagram 2600 of FIG. 26 once again reproduces the initial situation of FIG. 25 with the defect 2550 adjoining a pattern element 2510. However, unlike in FIG. 25, the area of the defect 2550 exposed by the repair shape 2620 using the electron beam 910 increases over the course of the etching process, i.e., with a growing number of defect exposures 2630, 2635 and 2640. This is elucidated by the arrows 2605 and 2615 in FIG. 26. This dynamic change of the exposed area from 2630 to 2640 leads to the etching profile 2660 at the edge 2680 of the forming side wall of the pattern element 2510. As a result of the dynamic increase of the area exposed by the repair shape 2620 there is an increase in the edge slope 2670 of the side wall of the pattern element 2510 forming during the etching process. This means that the side wall angle 2570 of the newly created side wall can be set by dynamically changing the repair shape 2620.

Figure 26:
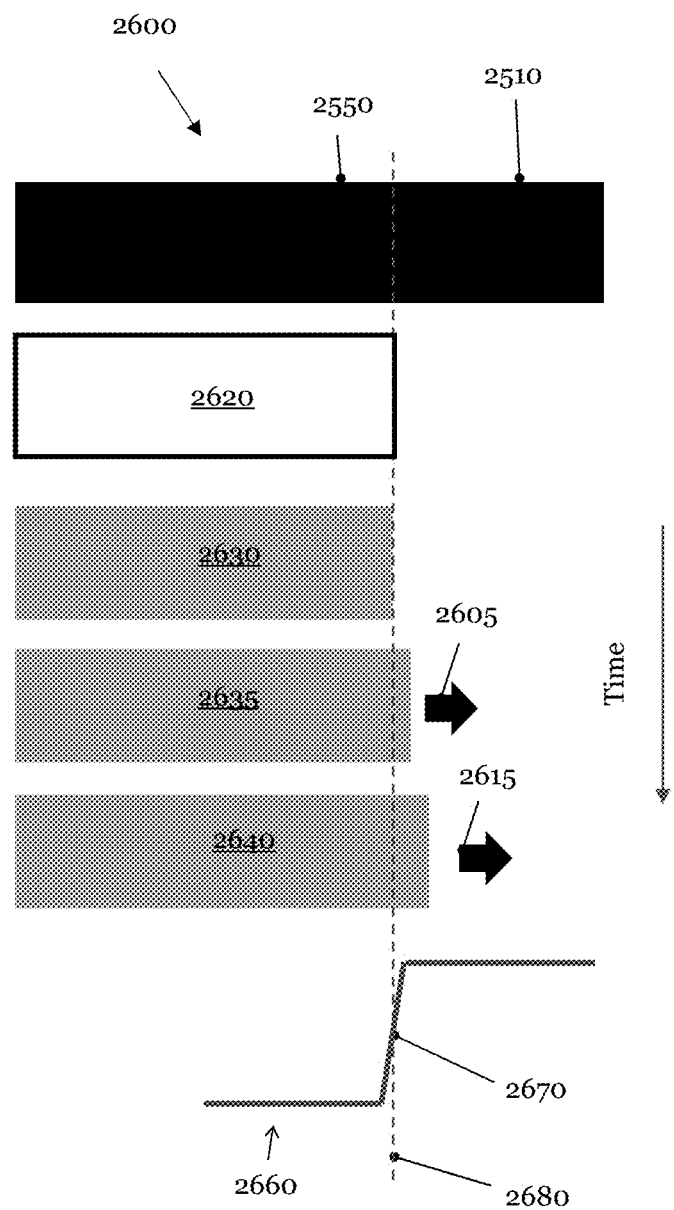
FIG. 26 schematically shows the etching of the defect of FIG. 25 using a repair shape that changes during the etching process.

Instead of or in addition to the change of the repair shape 2620, one or more process parameters of the EBIE process can be altered while the etching process is carried out (not depicted in FIG. 26).

Figure 27:
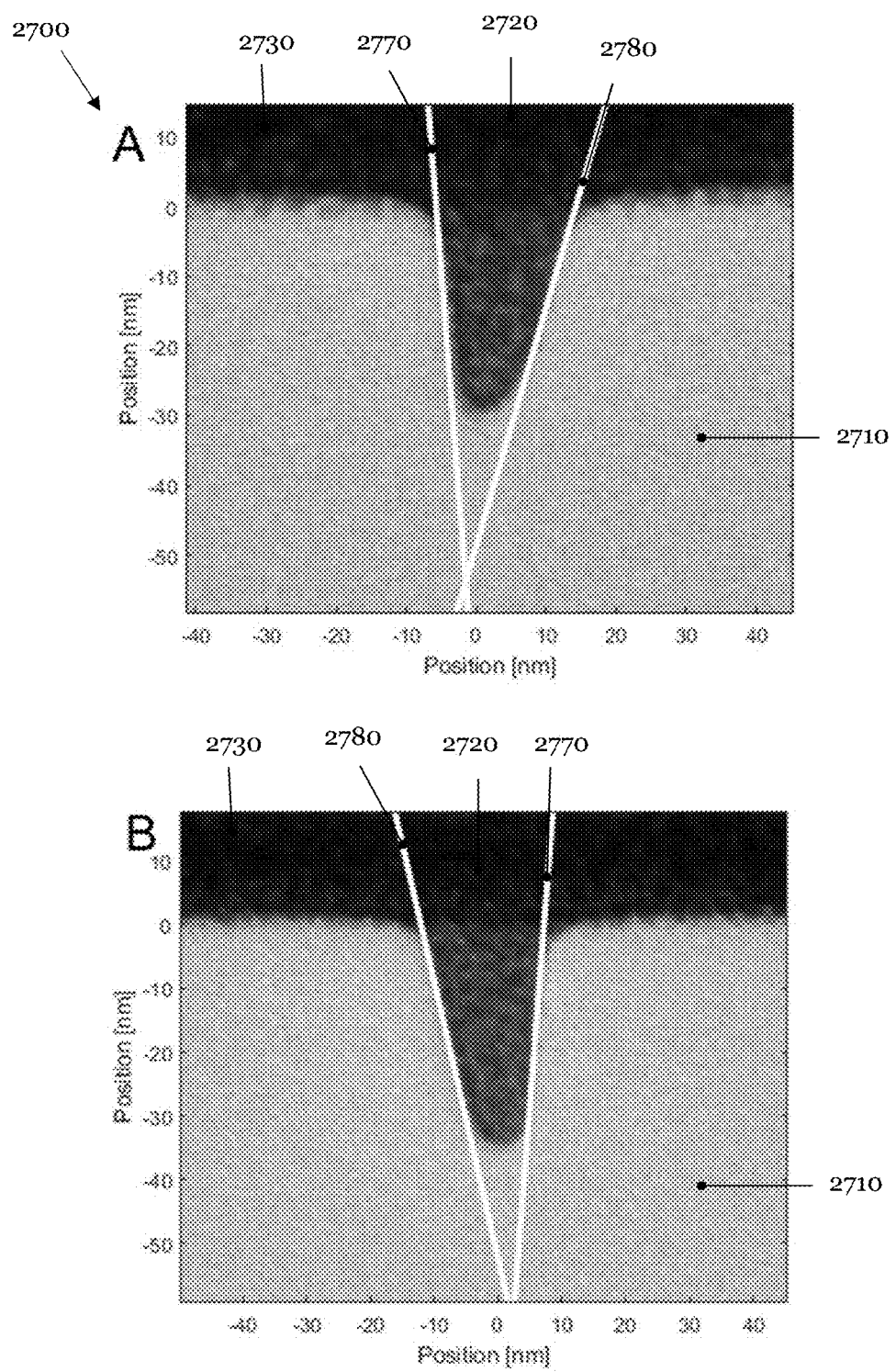
FIG. 27 shows the generation of different side wall angles when etching a cutout in the substrate of a photomask using a massive particle beam with an asymmetric beam profile.

Diagram 2700 of FIG. 27 presents a substrate 2710 of a photomask in the upper partial image A, into which substrate a depression 2720 has again been etched by use of an EBIE process. The depression 2720 was subsequently filled by the deposition of a metal 2730. The electron beam 910 had an asymmetric beam profile when etching the depression 2720. In FIG. 27, the two white, subsequently introduced lines specify the edge slopes 2770, 2780 of the depression 2720. As may be gathered from partial image A of FIG. 27, the asymmetric beam profile of the electron beam 910 is translated into a left side wall angle 2770 and a right side wall angle 2780 with different numerical values.

The lower partial image B of FIG. 27 shows the etching of a depression 2750 in which the asymmetry of the beam profile was changed through 180°. FIG. 27 illustrates that changing one or more parameters of the massive particle beam 910 allows a depression with adjustable side wall angles 2770, 2780 to be generated.

Figure 28:
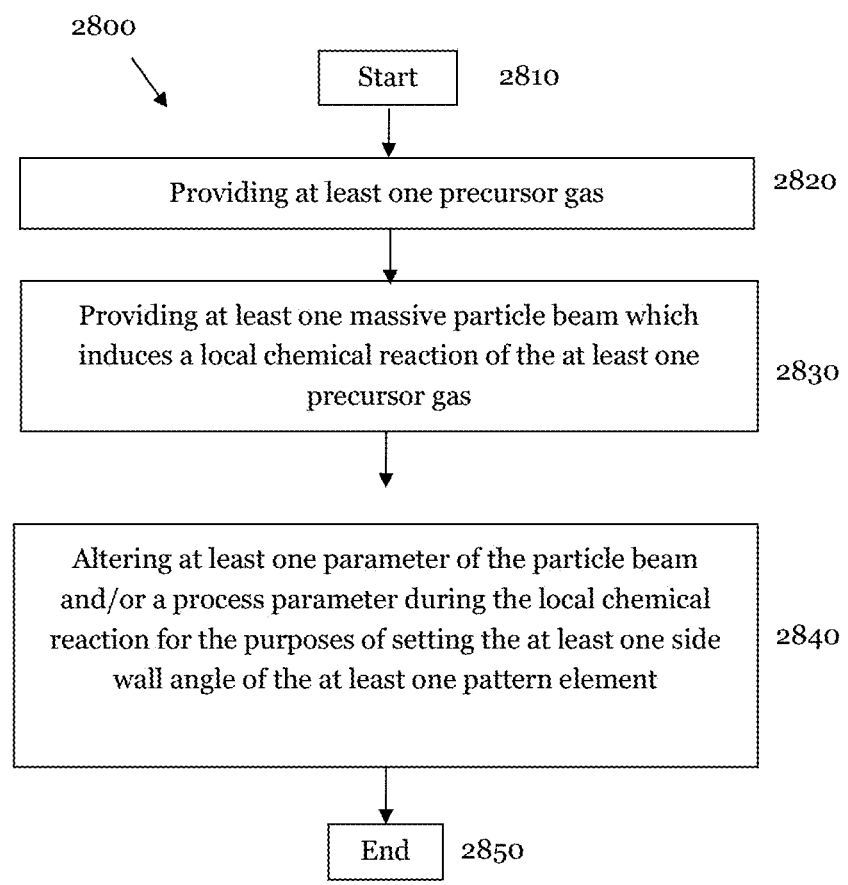
FIG. 28 specifies a flowchart of the method for setting a side wall angle of a pattern element of a photolithographic mask.

Finally, the flowchart 2800 of FIG. 28 presents the steps of the method for setting at least one side wall angle 170, 670, 1970, 2470, 2770, 2780 of a pattern element 120, 220, 230, 250, 260, 280, 290 of a photolithographic mask 150, 200, 700. The method begins in step 2810. At least one precursor gas is provided in the next step 2820. One or more precursor gases can be stored in one of the supply containers 1540, 1550, 1560 of the apparatus 1500 and can be guided by use of a gas feedline system 1545, 1555, 1565 to the location where the massive particle beam 910, 1215, 1515, 1930 is incident on a sample 1225, 1525.

Thereupon, in step 2830, at least one massive particle beam 910, 1215, 1515, 1930, 2120 which induces a local chemical reaction of the at least one precursor gas is provided. In step 2840, at least one parameter of the particle beam and/or a process parameter is altered during the local chemical reaction for the purposes of setting the at least one side wall angle 170, 670, 1970, 2470, 2770, 2780 of the at least one pattern element. The method ends in step 2850.

What is claimed is:

1. A method for setting at least one side wall angle of at least one pattern element of a photolithographic mask, the method including the steps of:
   a. providing at least one precursor gas;
   b. providing at least one massive particle beam which induces a local chemical reaction of the at least one precursor gas;
   c. altering at least one parameter of the particle beam and/or a process parameter during the local chemical reaction in order to set the at least one side wall angle of the at least one pattern element; and
   d. wherein a size of a repair shape in one dimension changes from a start to an end of the local chemical reaction by at least 5% in relation to a process resolution limit in one dimension.

2. The method of claim 1, wherein the at least one massive particle beam induces the local chemical reaction at the location of the side wall angle to be set.

3. The method of claim 1, wherein the at least one side wall angle is set while defects of the photolithographic mask are repaired.

4. The method of claim 1, wherein altering at least one parameter of the at least one particle beam comprises altering at least one element from the group of:
   a centrosymmetric setting of at least one condenser aperture of an imaging system of at least one particle beam source in respect of an optical axis of the massive particle beam,
   a non-round setting of at least one aperture of the imaging system of the at least one particle beam source,
   an adjustment of the imaging system of the at least one particle beam source for tilting the massive particle beam in relation to a perpendicular of a patterned surface of the photolithographic mask,
   a setting of a deflection system for tilting the massive particle beam in relation to the perpendicular of the patterned surface of the photolithographic mask, and
   a setting of a beam profile of the massive particle beam during the local chemical reaction.

5. The method of claim 1, wherein altering the at least one process parameter comprises at least one element from the group of:
   dividing a repair shape into at least two partial repair shapes for processing the at least two partial repair shapes with different process parameters, altering at least one parameter from the group of: a repetition time, a dwell time, a spacing of adjacent scanning points of the massive particle beam and an acceleration voltage of the at least one massive particle beam during the local chemical reaction,
   altering a size of the repair shape during the local chemical reaction; and
   altering a position of the repair shape during the local chemical reaction.

6. The method of claim 1, wherein the size of a repair shape in one dimension changes from the start to the end of the local chemical reaction by at least 30% in relation to a process resolution limit in one dimension.

7. The method of claim 1, wherein the position of an edge of a repair shape changes from the start to the end of the local chemical reaction by at least 5% in relation to a process resolution limit in one dimension.

8. The method of claim 1, further comprising the steps of:
   a. interrupting the local chemical reaction; and
   b. examining a defect residue of the at least one defect and/or of a side wall generated during the local chemical reaction.

9. The method of claim 8, further comprising the steps of:
   c. altering at least one parameter of the particle beam and/or of a process parameter which were previously left unaltered during the local chemical reaction should this be required by the examined defect residue and/or the generated side wall; and
   d. continuing the local chemical reaction with the at least one altered parameter or continuing the local chemical reaction with the unaltered parameters should this not be required by the examined defect residue and/or the generated side wall.

10. A method for examining at least one defect of a photolithographic mask using at least one massive particle beam, the method including the steps of:
    a. providing at least one massive particle beam; and
    b. altering a mean angle of incidence of the massive particle beam on the at least one defect during the examination of the at least one defect.

11. The method of claim 10, wherein the at least one defect comprises at least one element from the group of:
    missing material of a pattern element,
    excess material of a pattern element,
    missing material of a substrate of the photolithographic mask,
    excess material of the substrate of the photolithographic mask, a side wall angle outside a specified range,
    missing material of an element on a nanoimprint lithography (NIL) substrate and/or an NIL template,
    excess material of an element on an NIL substrate and/or an NIL template,
    a side wall angle outside a specified range,
    a radius of curvature of a side wall of the at least one pattern element in relation to its surface, which radius of curvature is outside a specified range, and
    a radius of curvature of the side wall of the at least one pattern element in relation to the substrate of the photolithographic mask, which radius of curvature is outside a specified range.

12. The method of claim 10, wherein altering the mean angle of incidence of the at least one massive particle beam comprises: deflecting the massive particle beam in an electric field and/or in a magnetic field.

13. The method of claim 10, further comprising the step of: determining parameters of a repair shape for the at least one examined defect.

14. The method of claim 10, wherein altering the mean angle of incidence comprises: altering the angle of incidence by >5° in relation to a perpendicular incidence of the at least one massive particle beam on a substrate of the photolithographic mask.

15. A computer program comprising instructions which, when they are executed by a computer system, cause the computer system to carry out the method steps of claim 1.

16. A computer program comprising instructions which, when they are executed by a computer system, cause the computer system to carry out the method steps of claim 10.

17. An apparatus for setting at least one side wall angle of at least one pattern element of a photolithographic mask, comprising:
   a. at least one gas provision system which is embodied to provide at least one precursor gas;
   b. at least one particle beam source which is embodied to generate at least one massive particle beam, wherein the at least one massive particle beam is embodied to induce a local chemical reaction of the at least one precursor gas; and
   c. at least one adjustment unit which is embodied to alter at least one parameter of the at least one particle beam source and/or at least one process parameter during the local chemical reaction in order to set the at least one side wall angle of the at least one pattern element; and
   d. wherein the at least one adjustment unit is further embodied to change a size of a repair shape in one dimension from a start to an end of the local chemical reaction by at least 5% in relation to a process resolution limit in one dimension.

18. The apparatus of claim 17, wherein the adjustment unit is further embodied to receive at least one element from the group of:
   measurement data of at least one defect, which were recorded at different angles of incidence,
   data of a three-dimensional contour of at least one defect,
   parameters of a repair shape of at least one defect,
   data of a defect residue of at least one defect,
   a side wall angle of at least one pattern element, and
   an angle of a generated side wall.

19. An apparatus for examining at least one defect of a photolithographic mask using at least one massive particle beam at different angles, comprising:
   a. at least one particle beam source which is embodied to generate at least one massive particle beam; and
   b. at least one adjustment unit which is embodied to alter a mean angle of incidence of the massive particle beam during the examination.

20. The apparatus of claim 19, wherein the adjustment unit is further embodied to control the altering of the mean angle of incidence of the massive particle beam on the at least one pattern element of the photolithographic mask on the basis of a parameterized repair shape.

21. The method of claim 10, comprising producing information about a three-dimensional contour of at least a portion of the at least one defect based on detected signals derived from the at least one massive particle beam at multiple mean angles of incidence.

22. The method of claim 21, wherein producing information about a three-dimensional contour comprises producing information about a three-dimensional contour of at least a portion of the at least one defect based on the detected signals derived from the at least one massive particle beam at the multiple mean angles of incidence with increased spatial resolution in a z-direction perpendicular to a surface of the mask, as compared to examining the at least one defect using the at least one massive particle beam with a single mean angle of incidence.

* * * * *